United States Patent
Horch et al.

(10) Patent No.: US 7,491,586 B2
(45) Date of Patent: Feb. 17, 2009

(54) SEMICONDUCTOR DEVICE WITH LEAKAGE IMPLANT AND METHOD OF FABRICATION

(75) Inventors: Andrew E Horch, Seattle, WA (US); Hyun-Jin Cho, Palo Alto, CA (US); Farid Nemati, Redwood City, CA (US); Scott Robins, San Jose, CA (US); Rajesh N. Gupta, Mountain View, CA (US); Kevin J. Yang, Santa Clara, CA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 353 days.

(21) Appl. No.: 11/159,514

(22) Filed: Jun. 22, 2005

(65) Prior Publication Data

US 2005/0233506 A1 Oct. 20, 2005

Related U.S. Application Data

(60) Continuation-in-part of application No. 10/670,881, filed on Sep. 25, 2003, now Pat. No. 7,075,122, which is a continuation-in-part of application No. 10/231,805, filed on Aug. 28, 2002, now Pat. No. 6,653,175, which is a division of application No. 09/814,980, filed on Mar. 22, 2001, now Pat. No. 6,462,359.

(51) Int. Cl.
*H01L 21/332* (2006.01)
*H01L 21/04* (2006.01)
*H01L 21/425* (2006.01)

(52) U.S. Cl. .......... 438/133; 257/163; 438/139; 438/140; 438/510; 438/515; 438/527; 438/529; 438/530; 438/531

(58) Field of Classification Search .......... 438/133, 438/136, 510–514, 517, 519–522, 527–534, 438/537, 543; 257/163
See application file for complete search history.

(56) References Cited

U.S. PATENT DOCUMENTS

| | | |
|---|---|---|
| 6,479,868 B1 | 11/2002 | An et al. |
| 6,506,654 B1 | 1/2003 | Wei et al. |
| 6,528,851 B1 | 3/2003 | Yu |
| 6,653,174 B1 | 11/2003 | Cho et al. |
| 6,653,175 B1 | 11/2003 | Nemati et al. |
| 6,690,038 B1 | 2/2004 | Cho et al. |
| 6,812,504 B2 * | 11/2004 | Bhattacharyya .......... 257/133 |
| 6,998,298 B1 * | 2/2006 | Horch .......... 438/133 |
| 7,118,980 B2 * | 10/2006 | Jain .......... 438/305 |
| 7,157,342 B1 * | 1/2007 | Tarabbia et al. .......... 438/303 |

* cited by examiner

*Primary Examiner*—Matthew S. Smith
*Assistant Examiner*—Phillip Green
(74) *Attorney, Agent, or Firm*—Fields IP, PS

(57) ABSTRACT

A method of fabricating a thyristor-based memory may include forming different opposite conductivity-type regions in silicon for defining a thyristor and an access device in series relationship. An activation anneal may activate dopants previously implanted for the different regions. A damaging implant of germanium or xenon or argon may be directed into select regions of the silicon including at least one p-n junction region for the access device and the thyristor. A re-crystallization anneal may then be performed to re-crystallize at least some of the damaged lattice structure resulting from the damaging implant. The re-crystallization anneal may use a temperature less than that of the previous activation anneal.

27 Claims, 12 Drawing Sheets

SEMICONDUCTOR DEVICE WITH LEAKAGE IMPLANT AND METHOD OF FABRICATION

RELATED DATA

This application is a continuation-in-part of U.S. application Ser. No. 10/670,881, filed Sep. 25, 2003, now U.S. Pat. No. 7,075,122 issued Jul. 11, 2006; which is a continuation-in-part of U.S. application Ser. No. 10/231,805, filed Aug. 28, 2002, now U.S. Pat. No. 6,653,175 issued Nov. 25, 2003; which is a divisional of U.S. application Ser. No. 09/814,980, filed Mar. 22, 2001, now U.S. Pat. No. 6,462,359 issued Oct. 8, 2002; each of which is hereby incorporated by reference in its entirety, and owned in common by the assignee of the this application.

FIELD OF THE INVENTION

The present invention is directed to semiconductor devices and, more specifically, to a thyristor-based semiconductor memory device with at least one of damage or leakage implant across a base-emitter junction region for a thyristor of the device.

BACKGROUND

The semiconductor industry has recently experienced technological advances that have permitted dramatic increases in integrated circuit density and complexity, and equally dramatic decreases in power consumption and package sizes. Present semiconductor technology may now permit single-die microprocessors with many millions of transistors, operating at speeds of hundreds of millions of instructions per second, to be packaged in relatively small semiconductor device packages. As the use of these devices has become more prevalent, the demand for faster operation and better reliability has increased.

An important part in the circuit design, construction, and manufacture of semiconductor devices concerns semiconductor memories; the circuitry used to store digital information. Conventional random access memory devices may include a variety of circuits, such as SRAM and DRAM circuits. SRAMs are mainly used in applications that require a high random access speed. DRAMs, on the other hand, are mainly used for high-density applications where the slow random access speed of DRAM can be tolerated.

Some SRAM cell designs may be based on NDR (Negative Differential Resistance) devices. They usually consist of at least two active elements, including an NDR device. The NDR device is important to the overall performance of this type of SRAM cell. A variety of NDR devices have been introduced ranging from a simple bipolar transistor to complicated quantum-effect devices. One advantage of the NDR-based cell is the potential of having a cell area smaller than conventional SRAM cells (e.g., either 4T or 6T cells). Many of the typical NDR-based SRAM cells, however, have not been widely adopted in commercial SRAM products because of certain limitations including, e.g., high standby power consumption due to the large current needed in one or both of the stable states of the cell; excessively high or excessively low voltage levels needed for the cell operation; sensitivity to manufacturing variations; poor noise-margins; limitations in switching speeds; limitations in operability due to temperature, noise, voltage and/or light stability; and associated manufacturability and yield issues which may be due to processes variations in fabrication and the like.

One type of NDR-based memory, a thyristor-based memory, has been recently introduced to potentially provide the speed of conventional SRAM at the density of DRAM in a CMOS compatible process. More specifically, a thin capacitively-coupled thyristor ("TCCT") type device may serve as a bi-stable element in memory applications. For more general details of such thyristor-based memory, reference may be made to: "A Novel High Density, Low Voltage SRAM Cell With A Vertical NDR Device," VLSI Technology Technical Digest, June, 1998; "A Novel Thyristor-based SRAM Cell (T-RAM) for High-Speed, Low-Voltage, Giga-Scale Memories," International Electron Device Meeting Technical Digest 1999, and "A Semiconductor Capacitively-Coupled NDR Device And Its Applications For High-Speed High-Density Memories And Power Switches," PCT Int'l Publication No. WO 99/63598, corresponding to U.S. patent application Ser. No. 09/092,449, now U.S. Pat. No. 6,229,161. Each of these documents is incorporated by reference in its entirety.

An important design consideration in any type of thyristor-based memory cell, including the TCCT memory cell, is the holding current of the thyristor. The holding current of the thyristor may refer to the minimum current required to preserve the thyristor's forward conducting state.

Another important consideration when using a thyristor-based memory cell may be its sensitivity to environmental factors that may cause error when it is in the blocking state. A thyristor may be vulnerable to error responsive to various adverse environmental conditions such as noise, light, anode-to-cathode voltage changes and high temperatures. Such vulnerability can affect the operation of the thyristor and result in undesirable turn-on, which in turn could disrupt the contents of the memory cell. Accordingly, there may be a compromise in the desire to reduce its vulnerability to adverse conditions and the desire to achieve low holding current.

During manufacture of a thyristor-based memory, various doping, implant, activation and anneal procedures may be performed. Some of these procedures may also be dependent on masking as may be used during patterning for the doping and implant provisions, as well as for patterning for other structures, such as polysilicon for the electrodes. These various procedures—e.g., patterning, masking, doping, implanting, siliciding annealing, etc.—during fabrication of the thyristor memory may, therefore, be understood to contribute to its overall manufacturing complexity, cost and size. The tolerances available for each of these procedures and the limitations in reproducibility therefor may further be understood to impact product reliability and yields.

SUMMARY

A method of forming a thyristor-based semiconductor memory device may include forming at least three regions of alternating and opposite polarity in a portion of semiconductor material for a thyristor-based memory cell over an insulator. A junction region that is defined between two of the three may be bombarded by species to establish through at least a portion of the junction a conductivity level greater than an intrinsic level otherwise available for the junction. In a particular example, the region may be bombarded with a damaging implant element of the group consisting of at least one of xenon, argon and germanium. In yet a further embodiment, an electrode may be formed over at least one of the three regions of alternating and opposite polarity.

Consistent with some embodiments of the present invention, the select regions of the thyristor-based memory cell may be bombarded with a damaging implant of xenon, argon and/or germanium. The bombardment may use an energy sufficient to cause crystalline damage in the substrate, and lend characteristics for leakage currents within the thyristor. The select region for the bombardment may include at least one p-n junction between an emitter region and a base region for the thyristor, and/or a junction between a source region and a body region for a MOSFET for accessing the thyristor.

In a particular embodiment, the bombardment with xenon may incorporate an energy effective to impact and dislocate at least a portion of silicon atoms from their original positions in a crystal lattice structure. An anneal may be performed to recrystallize at least a portion of the bombarded region. Further, the anneal may descend the defects to lower depths of the semiconductor material as may have been influenced by the bombardment. In some embodiments, the damaging bombardment and recrystallization anneal may each be performed after an activation anneal. Further, the recrystallization anneal may use a temperature less than that which is used for the activation anneal.

In further embodiments, the bombardment of xenon, argon or germanium into the silicon lattice may establish a low-level shunt or leakage current region for a diode junction region for a thyristor of the thyristor-based memory. This leakage current characteristic may be operable to stabilize operation of the thyristor.

In a further embodiment, an impurity species such as carbon may be implanted across one of the base-to-emitter junction regions of the thyristor while the damaging implant procedures may be used to treat the other of the base-to-emitter junction regions of the thyristor.

BRIEF DESCRIPTION OF THE DRAWINGS

Subject matter of embodiments of the present invention may be understood by reference to the following detailed description and with reference to the accompanying drawings, in which.

DETAILED DESCRIPTION

Figure 1:
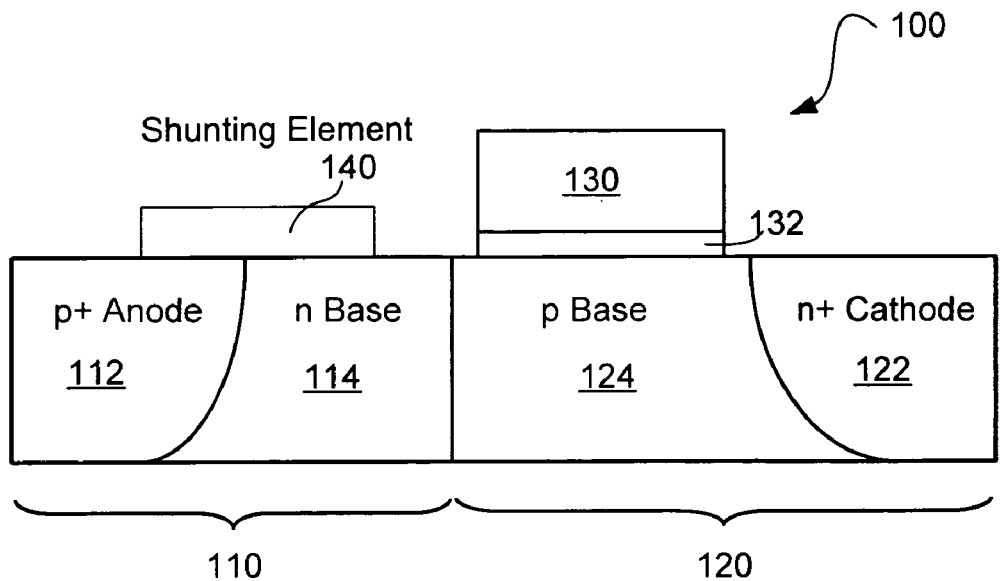
FIG. 1 is a simplified cross-sectional view of a portion of a thyristor for a thyristor-based semiconductor memory device according to an embodiment of the present invention, illustrating a shunting element across a p-n junction region, such as between an emitter region and a base region of the thyristor.

In the description that follows, readily established circuits and procedures for the exemplary embodiments may be disclosed in simplified form (e.g., simplified block diagrams and/or simplified description) to avoid obscuring an understanding of the embodiments with excess detail and where persons of ordinary skill in this art can readily understand their structure and formation by way of the drawings and disclosure. For the same reason, identical components may be given the same reference numerals, regardless of whether they are shown in different embodiments of the invention.

Embodiments of the present invention may be applicable to a variety of different types of thyristor-based memories and semiconductor devices, and have been found to be particularly useful for such devices benefiting from improved stability, e.g., as in the presence of disturbing environmental conditions such as high temperature, noise, light and voltage changes. While the present invention is not necessarily limited to such devices, various aspects of the invention may be appreciated through a discussion of various examples of this context.

As used herein, "substrate" or substrate assembly may be meant to include, e.g., a portion of a semiconductor wafer. Such portion may have one or more layers of material including, but not limited to Si, Ge, SiGe, and all other semiconductors that have been formed on or within the substrate. Layered semiconductors comprising the same or different semi-conducting material such as Si/Si, Si/SiGe and silicon-on-insulator (SOI) may be also included. These layers and/or additional layers may be patterned and/or may comprise dopants to produce devices (e.g., thyristors, transistors, capacitors, etc.) for an integration of circuitry. In forming these devices, one or more of the layers may comprise topographies of various heights. When referencing this integration of circuitry, therefore, it may be described as integrated together, on or with the substrate.

Furthermore, those skilled in the art will recognize that although embodiments of the present invention may describe fabrication for a particular sequence of dopant polarities, these dopant type(s) and the doped regions of a substrate may be reversed to form devices of opposite relative conductivity types—e.g., an N-type MOS transistor might be fabricated in such alternative embodiment for opposite conductivity type dopants so as to realize a P-type MOS transistor. Likewise, a thyristor may be described for an embodiment with an order of anode-emitter, N-base, P-base and cathode-emitter, wherein the anode-emitter may be attached, e.g., to a reference voltage and the cathode-emitter may be in common with a source/drain region of an access transistor. It will be understood that for the opposite relative conductivity embodiments, the cathode-emitter might be electrically coupled to a reference voltage and the anode-emitter in common with a source/drain for an access transistor of opposite type channel.

As referenced herein, portions of, e.g., a transistor or thyristor may be described as being formed in, at or on a semiconductor substrate. Such alternative terms in/at/on may be used individually merely for purposes of convenience. In the context of forming semiconductor devices, such terms may collectively reference portions of a semiconductor element that may be within and/or on a starting material.

According to one embodiment, a thyristor-based memory application may provide stable operation over a range of conditions, which may include noise, radiation, and deviation in voltage and temperature. A base region in one or both ends of the anode and cathode portions of the thyristor may define in part or be electrically coupled to a shunting element operable to shunt a low-level current and to enhance the thyristor's immunity to environmental influences such that transitions between an ON state and an OFF state might occur only in response to write and/or access control signals.

In another embodiment, a thyristor-based memory may comprise an array of memory cells. A memory cell of the array may comprise a capacitively coupled thyristor and a transistor to selectively access the thyristor. The thyristor may comprise anode and cathode end portions. Each end portion includes an emitter region and a base region defining a base-emitter junction therebetween. To enhance stability of operation and reliability for data retention of the thyristor, a shunt for low-level leakage current may be engineered to guard against inadvertent switching of states.

Various designs may be available for the low-level leakage current shunts for stabilizing thyristor operations. In general, the shunts may establish a holding current sufficient for maintaining the thyristor in a given state and to guard against its inadvertent switching from, for example, an OFF state to an ON state in the presence of environmental influences. At the same time, the design may also consider aims to limit power dissipation.

In some embodiments, the shunt may be disposed across at least a portion of a p-n junction region such as across a boundary region defined between a base region and its adjacent emitter region for the thyristor.

Referencing FIG. 1, a capacitively coupled thyristor 100 of a thyristor-based memory, in an embodiment of the invention, may comprise low-level current shunt 140. Anode and cathode end portions 110, 120 of the thyristor may comprise respective emitter regions 112 or 122 and base regions 114 or 124. For the cathode end portion 120 of the thyristor, electrode 130 may be disposed over and capacitively coupled to P-base region 124 via dielectric 132. Current shunt 140 may be electrically disposed across the boundary of emitter region 112 and base region 114, and may be operable to conduct a low-level current sufficient to stabilize thyristor 100 over a wide range of environmental conditions. In one example, the current shunt may be understood to establish a shunting resistance across at least a portion of the base-emitter junction for a magnitude in the range of a few mega-ohms to a few giga-ohms.

Various materials and processes can be used to form the shunt. For example, a region of the semiconductor material across the junction may be treated to serve as a high-resistivity shunt—such treatment may include implant of impurities and/or bombardment with high-energy ions for forming dislocations or other "effective" material across the diode-junction region of the base-emitter junction.

Figure 2:
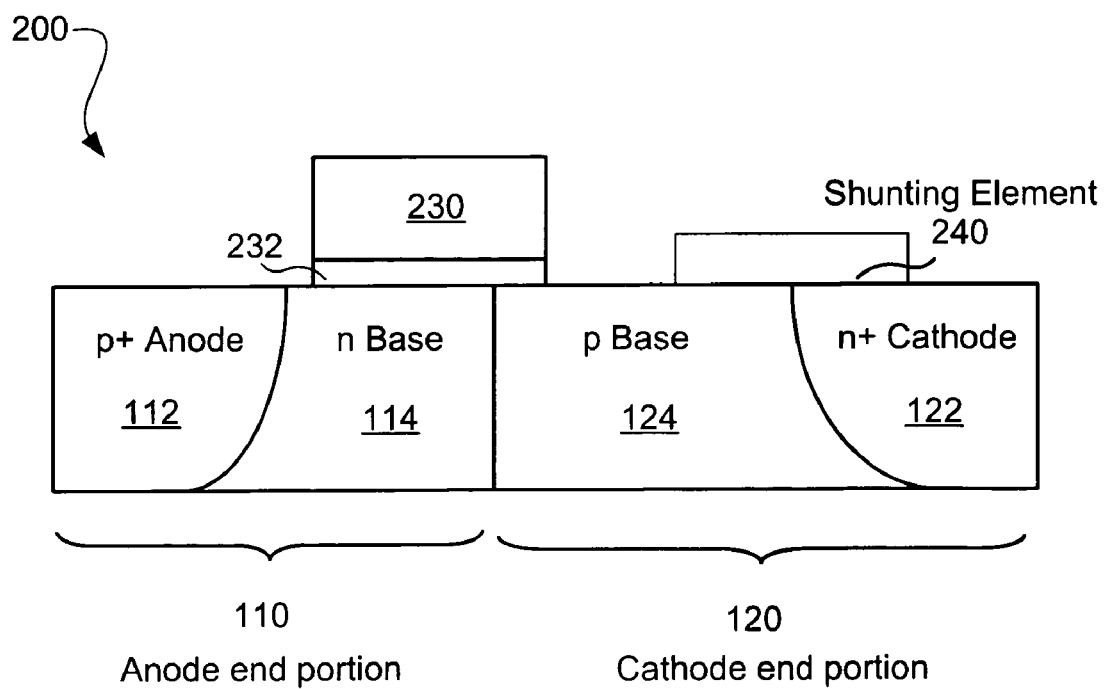
FIG. 2 is a simplified cross-sectional view of a portion of a thyristor for a thyristor-based memory according to another embodiment of the present invention, showing a shunting element across a junction between an emitter region and a base region of the thyristor.

In another embodiment, referencing FIG. 2, current shunt 240 may extend across a base-emitter junction defined between P-base 124 and cathode-emitter 122. It may be noted that similar portions of thyristor 200 of this embodiment (FIG. 2) may be annotated similarly to those described with reference to FIG. 1. The thyristor 200 may be described, similarly, with anode end portion 110 of anode-emitter and base regions 112, 114, and cathode end portion 120 of cathode-emitter and base regions 122, 124. In this embodiment, referencing FIG. 2, electrode 230 may be capacitively coupled via dielectric 232 to at least a portion of n-base 114. As illustrated simplistically in FIGS. 1 and 2, the differently doped regions of alternating, opposite polarity may be described as at least three contiguous regions of alternating, opposite conductivity type disposed sequentially in a layer of semiconductor material. Shunting element 140/240 may be formed to extend across the boundary(s) of at least one of the diode junction regions, e.g., between one of the respective emitter and base regions. In some embodiments, these regions for the thyristor may be formed in a layer of silicon as the semiconductor material over an insulator. In other embodiments, the shunting element might also be applied to thyristor (s) of alternative physical configurations such as vertical or mixed vertical/horizontal structures.

Thus, the shunt element for some embodiments can be formed across the base-emitter junction at the anode end portion or at the cathode end portion or to both of the anode and the cathode end portions. Further, these shunts may be fabricated by either and/or both of the leakage adjustment procedures—i.e., via the impurity implant(s) such as with carbon and/or the damaging implant/bombardment such as with Xenon, Argon or Germanium.

Figure 3:
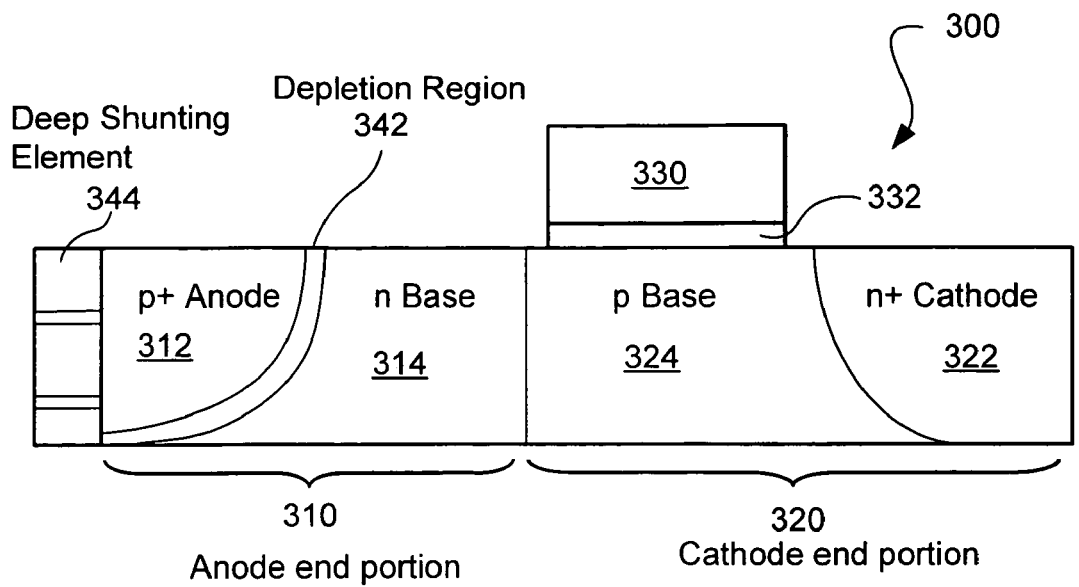
FIG. 3 is a simplified cross-sectional view of a portion of a thyristor for a thyristor-based memory according to another embodiment of the present invention, and showing a depletion region of a p-n junction between a base region and an emitter region of the thyristor and a deep shunting element across at least a portion of the depletion region.

Referencing FIG. 3, an embodiment of the present invention comprises capacitively coupled thyristor 300 with a shunting element 344 across a base-emitter junction region to enable a leakage current under given bias to flow between the base and emitter 314, 312 regions to the anode end portion 310. In this embodiment, the shunt may be represented schematically with a substantially vertical orientation within the layer of semiconductor material but still across at least a portion of the depletion region 342 defined between N-base region 314 and emitter region 312. Contact portion of the shunt 344 may be formed to directly contact emitter region 312; on the other hand, the second portion of the shunt may resistively contact base region 314 (across depletion region 342). Such shunt may be operable to conduct a leakage current between N-base region 314 and contact region 344 associated with emitter region 312. Electrode 330 may be capacitively coupled via dielectric 332 to at least a portion of p-base 324 of the cathode end portion 320.

Figure 4:
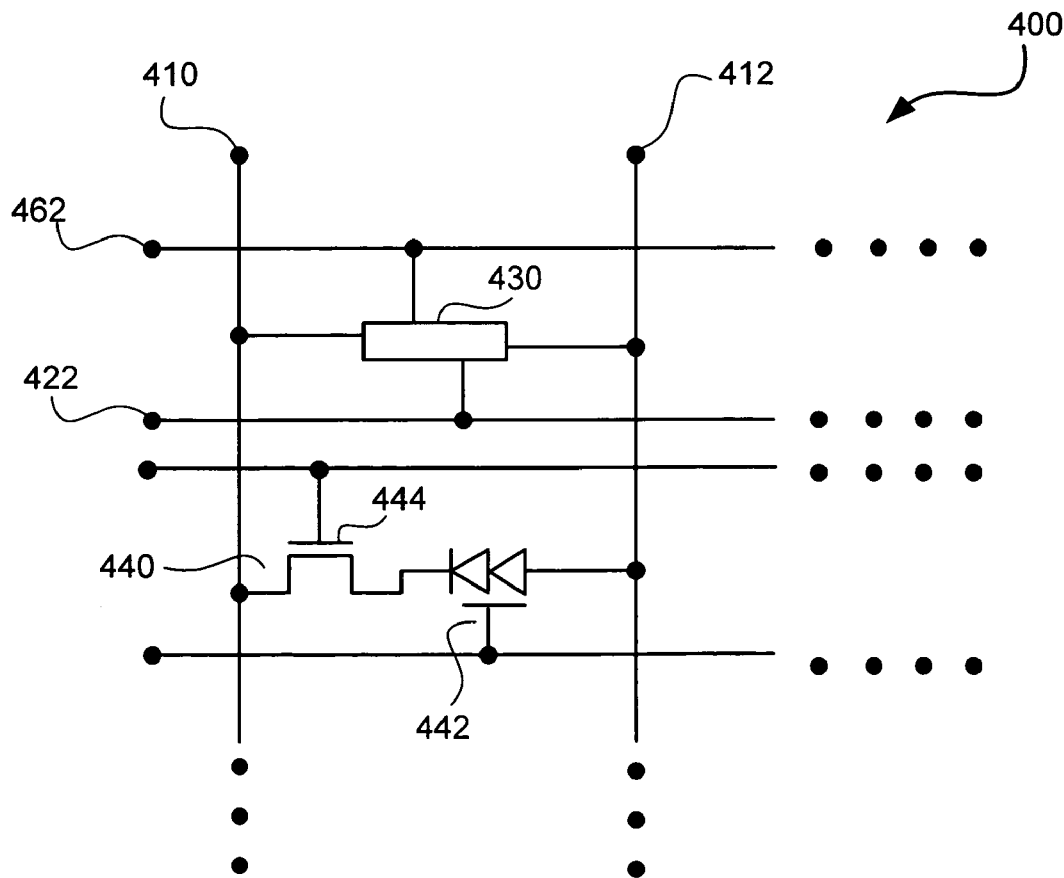
FIG. 4 is a simplified schematic diagram of a portion of a memory device, according to an embodiment of the present invention, showing a plurality of thyristor-based memory cells disposed in an array of rows and columns.

Referencing FIG. 4, in accordance with an embodiment of the invention, a thyristor-based semiconductor memory device 400 may comprise an array of memory cells such as cell 430. Such memory cell may comprise a thyristor with a shunt as disclosed herein for enabling, under given bias, a low-level current to/from a base region of either the anode or the cathode end of the thyristor. In this embodiment, thyristor 442 may be accessible to bitline 410 via access transistor 440, and the anode of the thyristor may be coupled to line 412 to receive a reference voltage. The capacitor electrode of the capacitively coupled thyristor may be electrically coupled to a second wordline, such as that illustrated by line 422 in FIG. 4. The gate 444 to the access transistor 440 may be electrically coupled to a first wordline, such as that illustrated by line 462 in FIG. 4. It may be understood that the first and second wordlines 462, 422 and the bitline and reference bitline 410, 412 of such memory cell may be repeated both horizontally and vertically to establish a memory array structure.

Figure 5:
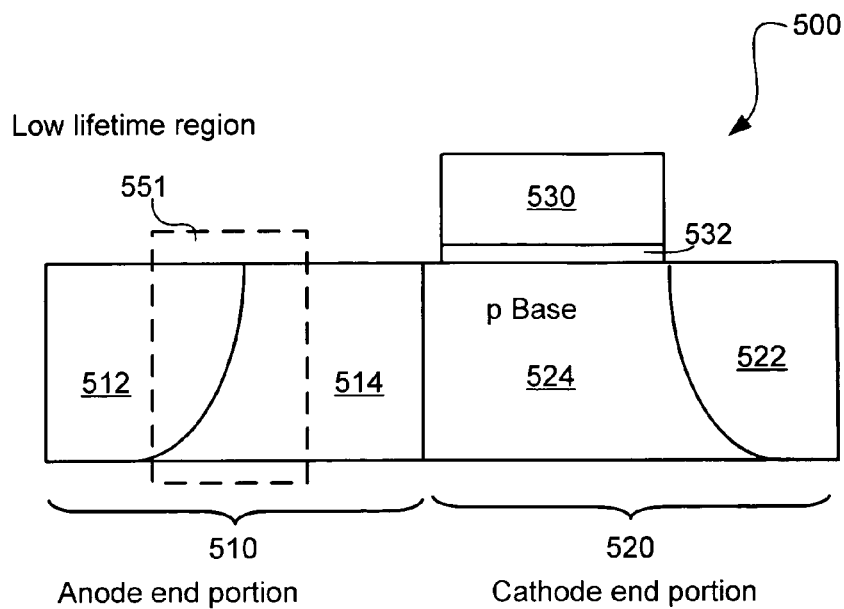
FIG. 5 is a simplified cross-sectional view to a portion of a thyristor-based semiconductor device according to another embodiment of the present invention, showing a low-lifetime region across a p-n junction region between, e.g., a base region and an anode-emitter region of the thyristor.

Referencing FIG. 5, in accordance with another embodiment of the present invention, a region 551 across at least one p-n diode junction of a base-emitter junction of a thyristor may be treated by implant of lifetime adjustment species. These species may be effective to lower an effective lifetime duration for minority-carriers, especially in a base-emitter depletion region. This may form a shunt operable to allow a low-level leakage current across the junction under given bias conditions that, in turn, may stabilize operation of the thyristor. In one embodiment, the low lifetime region 551 may be formed across at least a portion of the depletion region for the diode junction defined between anode-emitter region 512 and n-base regions 514 of anode end region 510 of the thyristor 500. In other embodiments, the diode junction region defined between the cathode-emitter region 522 and p-base 524 of the cathode end portion 520 may receive the implant for lifetime adjustment, and proximate the electrode 530 capacitively coupled via dielectric 532 to p-base 524.

For particular embodiments, the region 551 of lifetime adjustment across the base-emitter boundary may be treated by a variety of different species. For example, the region may be bombarded by ions of energy sufficient to dislocate atoms of the lattice structure and form regions of poly-crystalline, amorphous, or re-crystallized material structure(s), which may be operable to assist leakage under given bias across the base-emitter junction. Particle irradiation or ion implantation of sufficient energy may be understood and/or modeled for effecting such low-level leakage current characteristics across the p-n diode junction. In further embodiments, the incorporation of impurity species into the silicon region may also affect leakage. Such impurity species may include, e.g., gold and platinum or other metal.

Figure 6A:
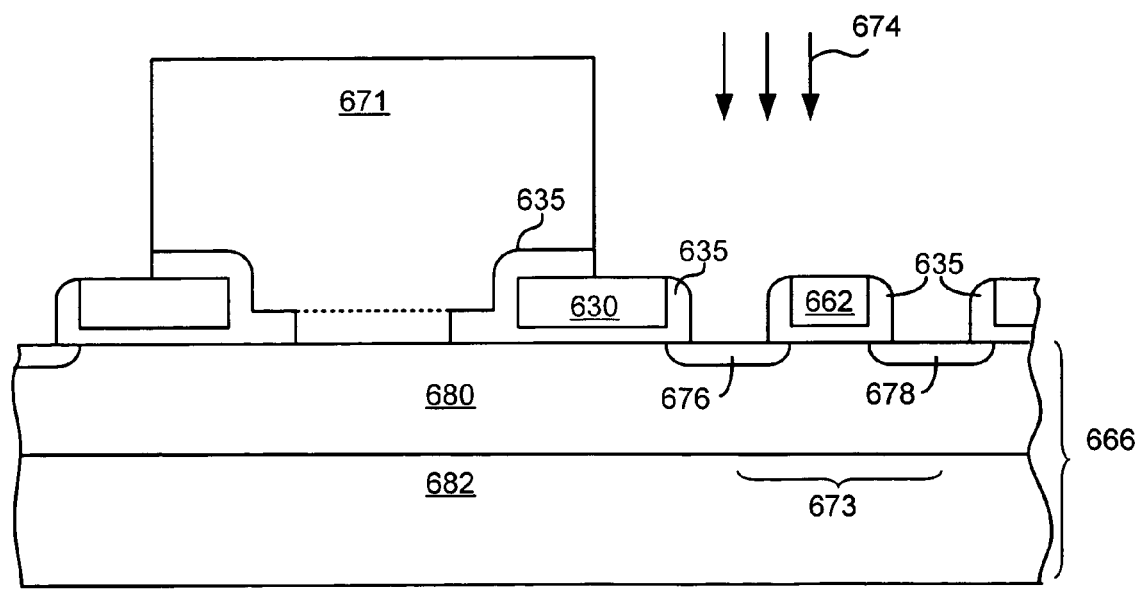
FIG. 6A is a cross sectional view of a portion of a thyristor-based semiconductor memory device in a stage of processing, useful to describe a method of processing for an embodiment of the present invention, and showing extension regions about a gate electrode to an access transistor for a thyristor-based memory.
Figure 6B:
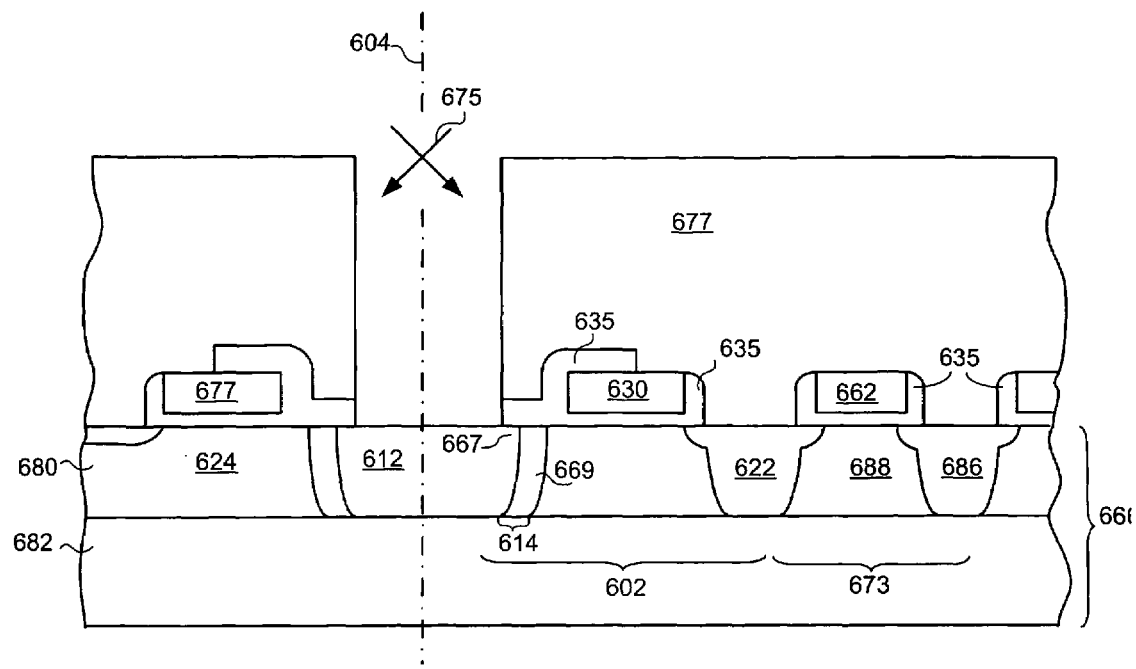
FIG. 6B is a cross sectional view of a portion of a semiconductor device of FIG. 6A, in another stage of processing and showing an implant to define at least one of a base region and an anode/cathode-emitter region for a thyristor memory.
Figure 6C:
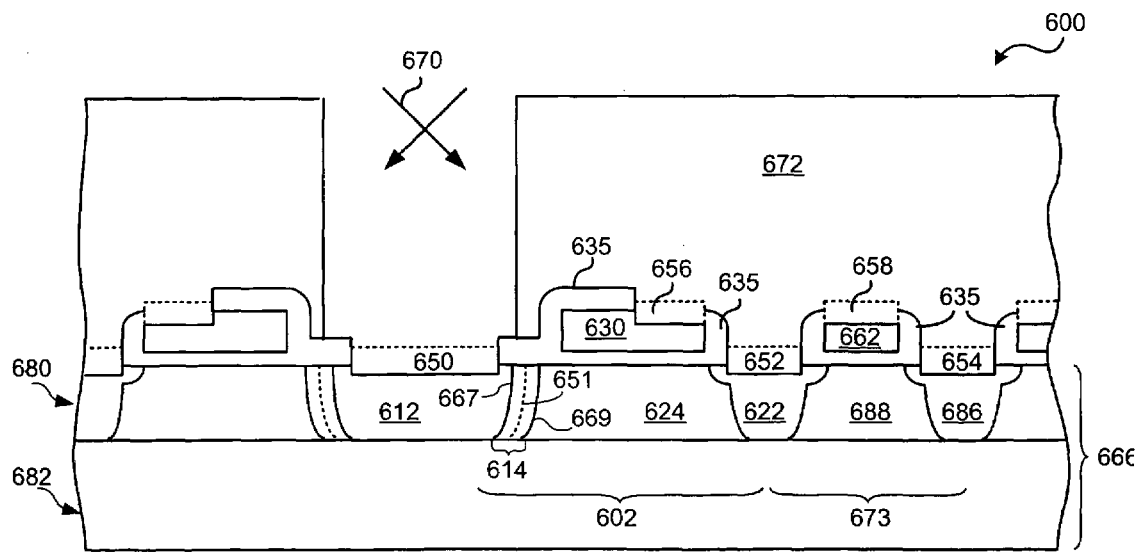
FIG. 6C is a cross sectional view of a portion of a semiconductor substrate useful to further describe a method of fabricating a thyristor-based semiconductor memory device for an embodiment of the present invention, showing an implant of lifetime adjustment species such as damaging bombardment elements to at least a portion of a p-n junction region to form a low-level leakage region, and also showing silicide that may be formed over particular regions for the thyristor-based memory.

Referencing FIG. 6C, memory device 600, in accordance with an embodiment of the present invention, may comprise capacitively coupled thyristor 602 disposed electrically in series with access transistor 673. The thyristor and access transistor may be formed in a layer of silicon 680 disposed over an insulator 682 of, e.g., an SOI substrate 666. Extending laterally, thyristor 602 may comprise anode-emitter region 612, N-base region 614, P-base region 624 and cathode-emitter region 622. The cathode-emitter region 622 may be formed in common with and as part of the drain/source region of access transistor 673. Electrode 662 may serve as the gate over the body or channel region 688 of the MOSFET as access transistor 673, and may be insulated from the body region by a dielectric such as an oxide. The gate electrode to the MOSFET may be operable under bias to effect an electric field in body region 688.

Although they are not shown specifically in FIG. 6C, contacts and conductive lines may be formed over and integrated together with the thyristor memory. For example, a reference voltage contact may be formed to contact an anode-emitter region of the thyristor. This contact may electrically link the anode-emitter region to a conductive line that may be disposed (as part of a multi-level metal structure) over the semiconductor substrate and electrically operable to receive a bias voltage. Likewise, a bitline (not shown) may be disposed over the substrate as part of the metal layers or conductive lines for the memory array and may be coupled to the source/drain region of an access transistor on a side thereof opposite the thyristor. This bitline may be electrically configured to transfer signals for data between the thyristor cell and read/write circuitry of the memory device.

In some embodiments, MOSFET 673 and thyristor 602 may be formed in a SOI substrate. These devices may also use silicide to lower the resistance of certain regions of the silicon. For example, thyristor-based memory 600 as represented by FIG. 6C, may comprise silicide regions 650, 652, 654, 656, 656, 658, over select regions of the thyristor 602 and MOSFET 673.

During the formation of the silicide regions, temperatures may be used of magnitude sufficient to diffuse metal into the silicon, lower than those for activating dopants (e.g. 1050 degrees Celsius for activation of dopants). These lower temperatures may therefore reduce dopant diffusion and assist the preservation of boundaries previously defined for the different implant regions of the thyristor and/or MOSFET.

Turning back with reference to FIG. 5, low-lifetime region 551 may be formed by implant of impurity species, e.g., lifetime adjusting species. These species may be annealed separately, and/or together with activation (high temperature anneal) of dopant implants and/or annealing for silicide formation. Accordingly, while some embodiments may implant lifetime adjustment species late in the fabrication process with an aim to control the extent of possible diffusion and boundary shifts impurities; other species for implant, such as carbon, may be introduced in a relatively early stage of the fabrication.

In further embodiments, carbon implants may be annealed at temperatures associated with dopant activation. The high temperature of the activation anneal may serve as one of the primary controlling parameters for the lifetime adjustment. The concentration of the carbon implants may also serve as another controlling parameter. With such embodiment(s), it has been found that carbon implants may be reasonably robust to other thermal cycles (which may have temperatures substantially less than that of the dopant activation) through a remainder of the device fabrication. Further, the other lower-level thermal procedures may have nominal effect over the resulting carbon-induced characteristics. This may allow, therefore, greater predictability for characteristics introduced for the devices by subsequent procedures and might also, therefore, assist greater production yield.

In further embodiments, a junction region of the thyristor-based memory cell may be bombarded with high-energy elements of xenon, argon and/or germanium for establishing a shunt through at least a portion of the junction region. It has been theorized and determined that the use of xenon, argon and/or germanium for the damaging bombardment may be modeled to impart effective dislocations within at least a portion the junction region. When combined with a subsequent anneal of given temperature for repair or recrystallization treatment, end-of-zone defects (i.e., between the descending region of the dislocation-repair and other regions of the semiconductor material) may be theorized and modeled with small diameters.

It may be further theorized, that by the smaller diameter effective defects and tighter deviations available with embodiments of the damaging implants together with the lower temperature re-crystallization anneals as disclosed herein, more consistent production may be achieved for imparting leakage properties across the junction region. In further particular embodiments, a heavy mass of xenon may be viewed to assist damaging bombardment with a greater degree of control for specific zones of semiconductor material targeted for dislocation. But regardless of the mass of the elements for ion bombardment, when the damaging bombardments in combination with the re-crystallization anneals of temperature less than activation anneals of these embodiments may be found/modeled as effecting polysilicon clusters of smaller size or granularity and reproducible with greater consistency.

Regardless of the proposed theories and understandings, the predictability in leakage properties for the devices produced by the damaging implants of xenon, argon and/or germanium in combination with the late stage introduction within the process flow and associated lower temperatures for the recrystallization anneals per the bombardment embodiments may be found to enable fabrication of thyristor-based memory devices with better consistency and production yield.

In a particular further embodiment, carbon may be used as an impurity implant in the cathode end portion of the thyristor as the primary contributor to the shunt formed across the base-to-emitter junction region; while the shunt to the anode end portion of the thyristor (i.e., across at least a portion of the junction between the p-base and anode-emitter regions) may be effected primarily by damaging bombardment.

Figure 7:
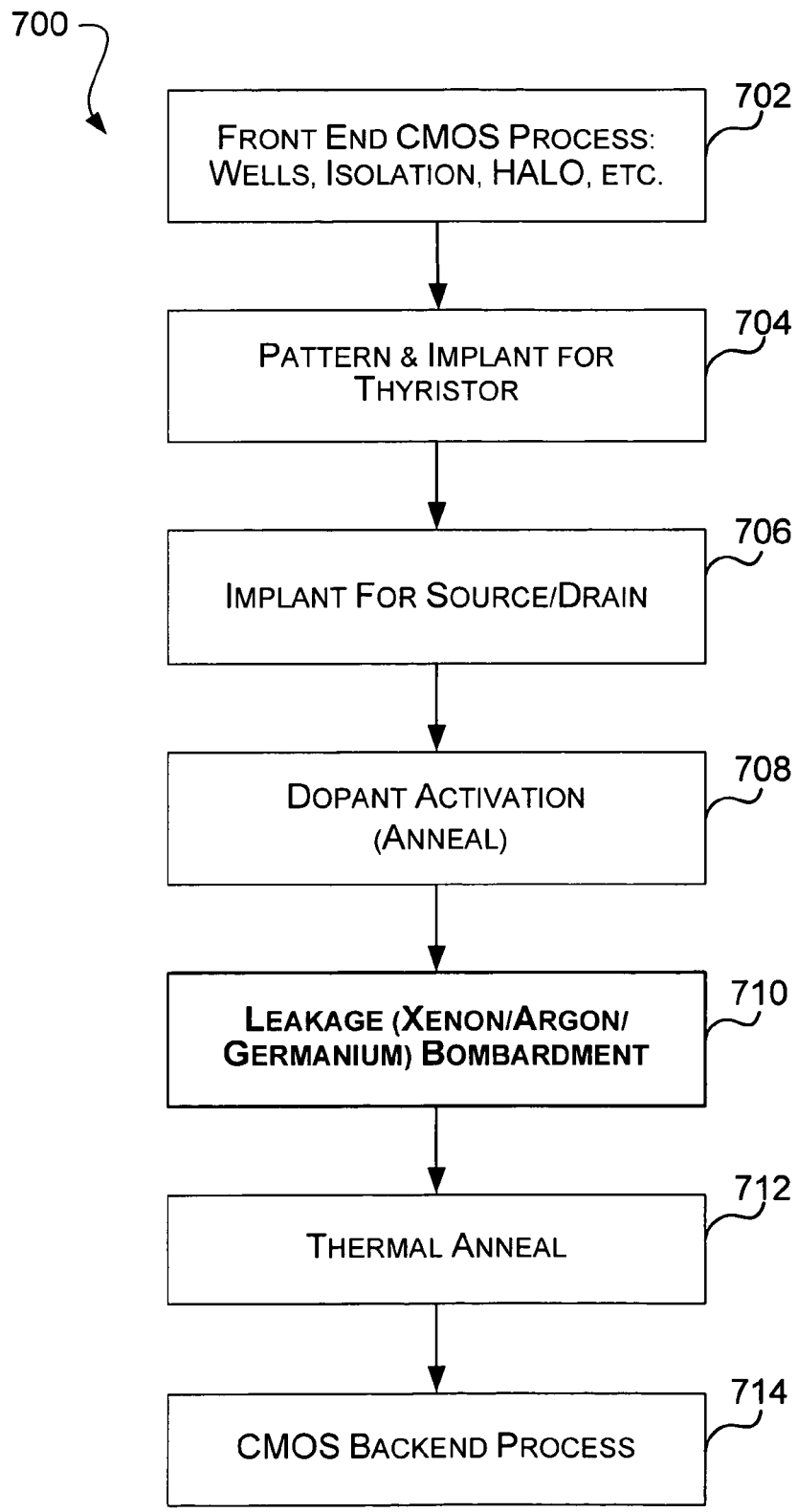
FIG. 7 is a simplified flow chart useful for describing a method of processing a thyristor-based memory in accordance with an embodiment of the present invention, and showing a leakage bombardment and anneal in a late stage of the fabrication flow.

Referencing FIG. 7, a method of processing a thyristor-based semiconductor memory device (method 700 of FIG. 7) may begin by forming the opposite conductivity well regions. For example, N-type dopant may then be implanted for the formation of an N-well within, otherwise, P-type semiconductor material of a starting substrate. Additionally, an isolation trench might also be formed to define different active region(s). These initial procedures may be understood to be represented within block 702 of the simplified flow chart of FIG. 7—e.g., the front-end CMOS process for the formation of wells, isolation, etc. Further, it may be understood that the procedures of block 702 might also be representative of initial front-end processes for an SOI substrate.

Referencing FIG. 6A, dielectric may be formed over a layer of silicon of an SOI substrate 666, as may be incorporated as part of the preliminary "CMOS Process" (block 702 of FIG. 7). The dielectric may be formed as a thermal oxide and may be described alternatively as a gate oxide or gate dielectric. Conductive polysilicon may then be patterned thereover to define electrodes 630, 662. One electrode 662 may be for the gate of MOSFET 673 and the other electrode 630 may be for the capacitor electrode associated with the capacitively coupled thyristor. The electrode 662 for the MOSFET gate may be formed in insulated relationship over a gate oxide over body region 688. The electrode 630 for the capacitively coupled thyristor may be formed in insulated relationship over a base region for the thyristor. The capacitor electrode may be described as capacitively coupled thereto via the dielectric (e.g., a thermal or gate oxide or other insulator). In one example, the dielectric may be formed with a thickness of between 5 nm and 30 nm, more typically about 10 nanometers. The polysilicon for the electrodes may be formed with a thickness of between about 80 nm and 1000 nm, and typically around 200 nanometers.

N-type extension regions 676, 678 (e.g., for lightly doped drain or LDD regions) may be formed in the silicon relative to and about gate electrode 662. In one embodiment, the implants for the extension regions may be formed using phosphorous with an implant dosage of about $8 \times 10^{14}$ per $cm^2$.

Although particular magnitudes may be described for the doping levels, material thickness, extents and dimensions for given embodiments; it will be understood that these magnitudes may be merely exemplary and that alternative magnitudes may be available therefore—e.g., alternative parameters for the oxide thickness, implant species or densities as may be used for defining these devices of alternative specifications. For example, in some embodiments, substrate 666 may comprise an SOI substrate with a silicon layer of about 1000 angstroms. The gate dielectric may comprise a thermal oxide of about 2 nanometers, and the N-type extension regions may be formed from a species of arsenic implanted with, e.g., a 7-degree angle.

Halo implants might also be formed around the gate electrodes—i.e., between or proximate extension regions 676, 678 and the body region. In a particular embodiment, the halo implants may be formed with, e.g., boron.

After defining the extensions and halos, sidewall spacers 635 may be formed against the sidewalls of the gate electrode. A dielectric such as nitride may be formed conformal to and over the substrate and electrodes. An anisotropic etch may be used to etch the dielectric and form the sidewall spacers 635 against sidewalls of the electrodes. In some embodiments, these sidewall spacers may be formed while masking regions of the substrate for the thyristor.

Further referencing FIG. 6A, photoresist 671 may be formed to mask portions of the substrate to be associated with regions for the thyristor. Other regions of the substrate, e.g., for the CMOS devices, may then be processed (block 702 of FIG. 7) to define additional provisions therefore, e.g., further portions of access transistor 673.

Referencing FIGS. 6A-6B, N-type species 674 may be implanted to form the deeper level source and drain regions 622, 686 (block 706 of FIG. 7) in the layer of silicon 680 about gate electrode 662. In a particular embodiment, these implants may use species such as arsenic. In one example, the implant for the source/drain regions may use energy and dosage to penetrate a full depth of the layer of silicon 680, e.g., energy of about 40 keV and dosage of about $2\times10^{15}$ ions per cm$^2$.

In alternative embodiments of the present invention, the source/drain implants may be performed in a later stage of the fabrication flow, e.g., as represented by the phantom line presentation for block 706. For such embodiment, the thyristor implants for N-base region 614, anode-emitter region 612 and lifetime adjustment may be performed before these implants for the deep level source/drain regions.

In yet a further embodiment of the present invention, the deeper level implants for the source/drain regions for the MOSFET may be performed in-situ or in common with implant for formation of anode-emitter region 612.

Returning with reference to FIGS. 6A-6B, mask 671 may be removed and additional photoresist 677 layered and patterned to assist formation of the base and anode-emitter regions for the thyristor (block 704 of FIG. 7). Using photoresist 677 as an etch mask, regions of dielectric may be removed, e.g., from between the electrodes of two different thyristor devices (and about mirror axis 604). For example, an etch, such as an anisotropic etch, may be used to remove the exposed regions of dielectric and to clear corresponding portions of the layer of silicon of substrate 666 as defined by the window through photoresist 677. The etch may form a shoulder to dielectric 635, adjacent and extending laterally outward from electrode 630 toward the anode-emitter region. In one embodiment, the lateral extent of the shoulder formed with salicide blocking (SAB) material 635 may comprise a distance greater than its conformal thickness. In a further embodiment, it may comprise a distance sufficient to form an N-base region (e.g., lateral width of up to about 100 nm) therebelow and with a lateral offset relative to a peripheral wall or edge of electrode 630.

Further referencing FIG. 6B, patterned dielectric 635, and photoresist 677 may be used collectively as an implant mask during formation of N-base region 614 and anode-emitter region 612. For example, an implant 675 for the formation of the N-base region may use a species such as phosphorous, with an implant angel of about 60 degrees (relative to the normal), energy of about 60 keV, and dosage of about $4\times10^{14}$, twisted. It will be understood that the specifics for the implant species, angle and energy in combination with the lateral extent of the implant mask may be selected with parameters sufficient to define boundary 669 for N-base region 614 beneath the shoulder of SAB material 635 and laterally offset from capacitor electrode 630.

For example, in another embodiment, the implant for the N-base may use an implant species of arsenic, an implant angle of about 60 degrees, energy of about 10 keV, and dosage of about $1\times10^{15}$ per cm$^2$, twisted.

Further referencing FIG. 6B, after performing the N-type implant for N-base region 614, the same mask may be used during implant of P-type species to form anode-emitter region 612. In one embodiment, a species of boron may be used with an energy of about 9 keV, implant angle of less than about 4 degrees (relative to the normal) and dosage of at least $3\times10^{16}$ per cm$^2$, twisted. Again, these levels are representative of simply one embodiment.

After implanting regions for N-base 614 and anode-emitter region 612, photoresist 677 may be removed. As mentioned previously, in accordance with some embodiments of the present invention, the deep level implants (706 of FIG. 7) for source/drain regions 622, 686 of MOSFET 673 may be performed after the implants (block 704 of FIG. 7) for definition of the base, anode-emitter and lifetime adjustment regions for thyristor 602. In other embodiments, the deep level source/drain regions may have been formed previously and fabrication thereafter comprises implanting of the lifetime adjustment species.

The implant for lifetime adjustment may use the same mask for the alignment and definition of the extent for the lifetime adjustment region, where the implant species selected (e.g., carbon) may tolerate the high temperatures that may be associated with the dopant activation anneal In a particular embodiment, implant 670 may use a species of carbon, an implant energy of about 13 keV, angle of 45 degrees, and dosage of about $5\times10^{15}$ atoms per cm$^2$, twisted. Being twisted, shadowed regions may thus receive an effective dosage of about one-half that of the overall dosage. In other words, for this example, regions beneath an edge of a mask may receive a dosage of about $2.5\times10^{15}$ atoms per cm$^2$. In alternative embodiments, carbon may be implanted into the silicon during an earlier stage of the fabrication process, for example, before not only the dopant activation anneals, but also before the dopant implants associated with the thyristor and CMOS regions.

An activation anneal may then be performed using a temperature of between 900 and 1200 degrees Celsius; and in a particular embodiment, around 1050 degrees Celsius. This activation anneal may last for a duration greater than 5 seconds, and in a given embodiment, about 10 seconds. Following the anneal for the activation of dopants, another mask may be defined to define select regions of the silicon layer to receive the damaging implants.

Moving forward with reference to FIG. 6C, additional photoresist 672 may be formed over the substrate and patterned to protect select regions of the substrate—e.g., as may be associated with the access transistor 673. A damaging implant 670 may then be performed (block 710 of FIG. 7) to form a shunt region of the thyristor. In this embodiment, the damage implant may be aligned relative to the peripheral edge or the shoulder of SAB material 635. Alternatively, the damaging implant may be self-aligned relative to the peripheral edge(s) of photoresist 672 and/or collectively with SAB material 635.

Represented by dashed line 651 of FIG. 6C, the boundary of the damaging implant may extend to overlap at least a portion of the junction region 667 between anode-emitter region 612 and N-base region 614. But, the extent of the region therefore may remain substantially clear of boundary 669 between N-base region 614 and P-base regions 624. The damaging implant for forming the shunt region may use an ion species of the group consisting of column IV and/or column VIII of the periodic table, and more preferably for some embodiments, germanium (Ge), argon (Ar) and/or xenon (Xe).

Further referencing FIGS. 6C and 7, an anneal may be performed (block 712 of FIG. 7) to repair at least some of the damage sites within the silicon, which may have resulted from the ion bombardment. For example, when implanting ions of germanium, argon or xenon, some of the elements may impact the silicon with energy sufficient to transform regions of the lattice structure of the silicon into poly or an amorphous material state. Accordingly, the subsequent anneal might then be performed to restore some of the damaged regions. In further embodiments, the temperature and the duration of the anneal may be selected appropriately to repair some, but not all regions. Residual polycrystalline regions may remain across at least portions of the emitter-to-base junction. These residual polycrystalline regions, in turn, may serve as a partial shunt to allow low-level leakage currents across at least a portion of the junction region during certain operations of the thyristor.

Figure 8A:
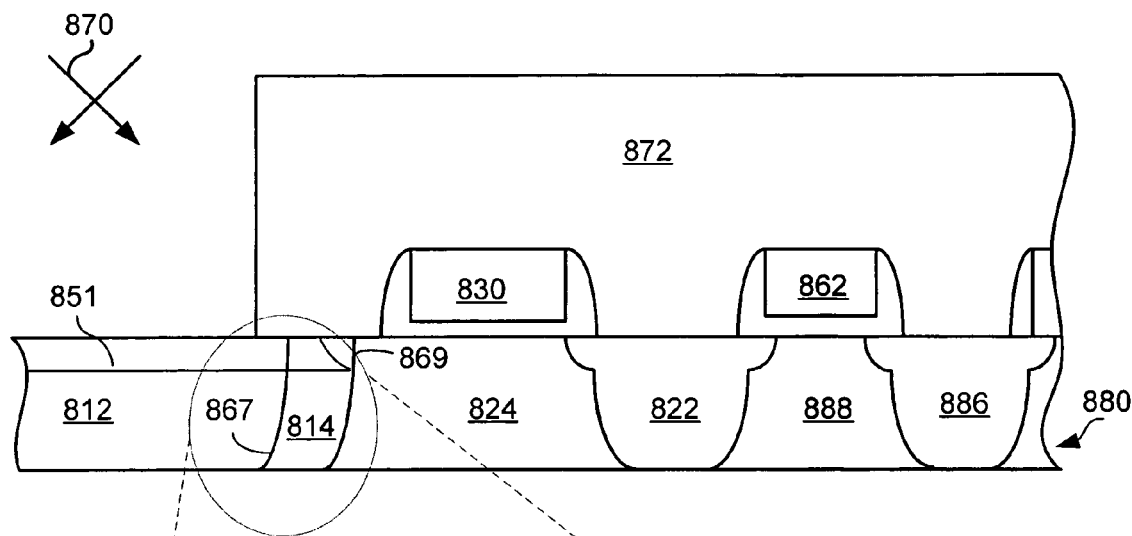
FIG. 8A is a cross sectional view of a portion of a thyristor-based semiconductor device during a stage of processing, useful for describing a method of processing a semiconductor device for another embodiment of the present invention, and showing alignment of lifetime adjustment implants across a junction region between base and emitter regions for a thyristor.
Figure 8B:
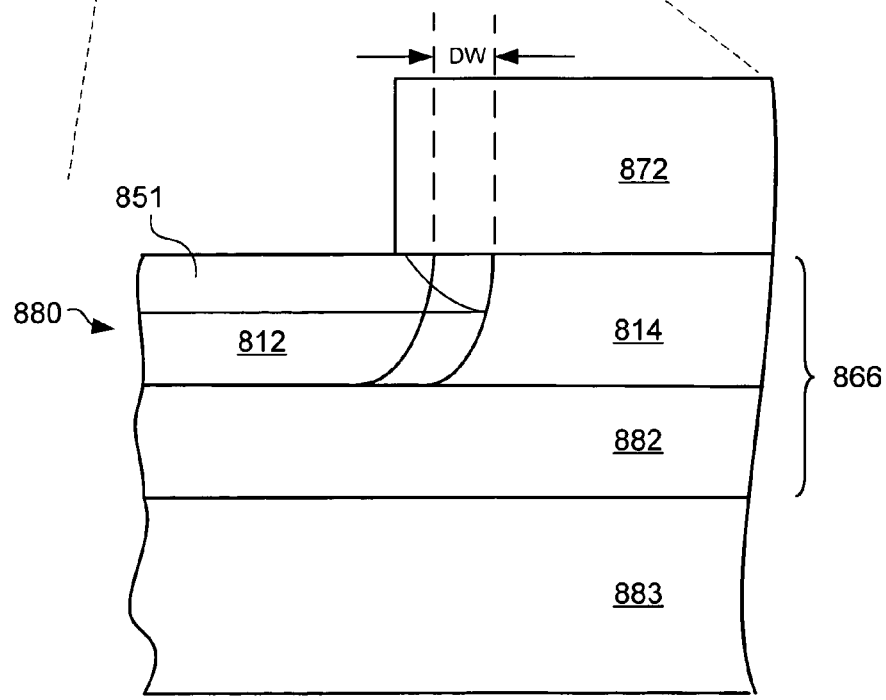
FIG. 8B is a cross sectional and exploded view of a portion of a thyristor-based semiconductor device in simplified representation showing a damaging implant region extending across at least a portion of a depletion region for a p-n junction between, e.g., an emitter region and a base region of a thyristor device.

Referencing FIGS. 8A and 8B, gate electrode 862 may be formed over a body region 888 to a MOSFET device; and capacitor electrode 830 may be formed over a base region 824 for a thyristor. In the previous stages of the fabrication, it may be understood that extension and halo regions for the MOSFET device may have been implanted while masking regions of the silicon layer for the thyristor. After forming the extension regions, spacers may be defined against sidewalls of the electrodes. In one embodiment, deep level implants 822, 886 for the source and drain regions of the MOSFET may then be formed—i.e., before the implants for the thyristor N-base region 814, anode-emitter region 812 and low-lifetime region 851. In alternative embodiments, the deep level implants may be performed after the implants for the thyristor. Typically, the deep level implants may penetrate a full depth of silicon layer 880 of an SOI substrate. It may be further understood that silicon layer 880 may be disposed over buried oxide 882 of SOI substrate 866 with supporting material 883 (e.g., of a silicon wafer) to support buried oxide 882 and silicon layer 880.

Further referencing FIGS. 8A, 8B, photoresist 872 may be formed over the silicon layer and electrodes. The resist may be patterned to assist alignment of implants for definition of N-base region 814, anode-emitter region 812 and/or a low-lifetime adjustment species for defining low-lifetime region 851. An implant for N-type dopant for N-base region 814 may use an implant angle of about 60 degrees relative to the normal. P-type dopant for the anode-emitter region 812 may use an implant angel of within about ±10 degrees of the normal; and, more typically, about ±4 degrees. The lifetime adjustment species may be implanted with an angle of incidence between that which was used for the base region and that which was used for the anode-emitter—e.g., in a particular embodiment, an implant angle of about 45 degrees may be used for the implant of the lifetime adjustment species.

It may be understood that the depletion region width (DW) of junction region 867, referencing FIGS. 8A and 8B, may depend on the doping levels on either side thereof in addition to respective bias levels. In certain examples and applications, the depletion region may comprise a width from tens to hundreds of nanometers. Thus, the implant for the lifetime adjustment may select species, implant energy and dosage sufficient to achieve concentration/impacts in the depletion region to reliably effect its shunting for low-level leakage characteristics. In some embodiments, the parameters for the lifetime adjustment implants and bombardments may be selected to establish a shunt with leakage characteristics across the junction region substantially greater—e.g. at least two times greater—than that for the junction absent the adjustment implant/bombardments such as when biased at a given reverse voltage potential.

Further referencing FIG. 8B, as the size of memory devices shrink; the size (area and/or volume) of the depletion region DW between the emitter region 812 and the base region 814 may impact a reliability of device fabrication. It may be theorized that for a given type of lifetime adjustment bombardment and/or implant, a probability of achieving a target shunt design of given low-level leakage effects across junction region 867 may depend on various parameters, such as the area or volume available in the depletion region for receiving a damage site, an average size of the damage sites, and also their density or distribution.

For thyristor memory devices of large geometry (e.g., a cross-sectional area to a junction between an anode-emitter and N-base of 100 nm×10 um), a variety of different implant species (e.g., of metal, column IV and column VIII) and/or methods of implant might be effective to reliably avail lifetime adjustments for low-level leakage effects across the junction. However, at some geometries (e.g., a cross-sectional area to a junction between anode-emitter and N-base less than 100 nm×180 nm), the type of species selected and its method of implant and anneal may have a more dramatic impact upon the resulting lifetime in the low-lifetime region and the resulting low-leakage characteristics for the shunt.

For purposes of assisting an understanding of certain embodiments, it may be useful to theorize certain types of implants for lifetime adjustment or leakage bombardment as forming relatively large "macro" size defects. These could be described as measurable, for example, with an average diameter of about 1 to 10 nanometers.

For other types of implant and/or bombardment adjustments, the effective lifetime adjustment may be modeled as offering defects of greater granularity—i.e., of "micro" size defects. These "micro" defects may be described with an average diameter less than the "macros"—e.g., less than about 1 nm. Although capable of being predicted and modeled, these micro defects may or may not actually be measurable. By forming such "micro" defects with an appropriate density, leakage characteristics as may be modeled therefor may be more reliably established across depletion regions of small geometry. In one example, germanium, argon and/or xenon may be used to impact at least a portion of a junction region with energy and dosage sufficient for achieving a relatively high density for such micro defects, e.g., as may be modeled therefor of about $10^{19}$ atoms per centimeter cubed.

Figure 9:
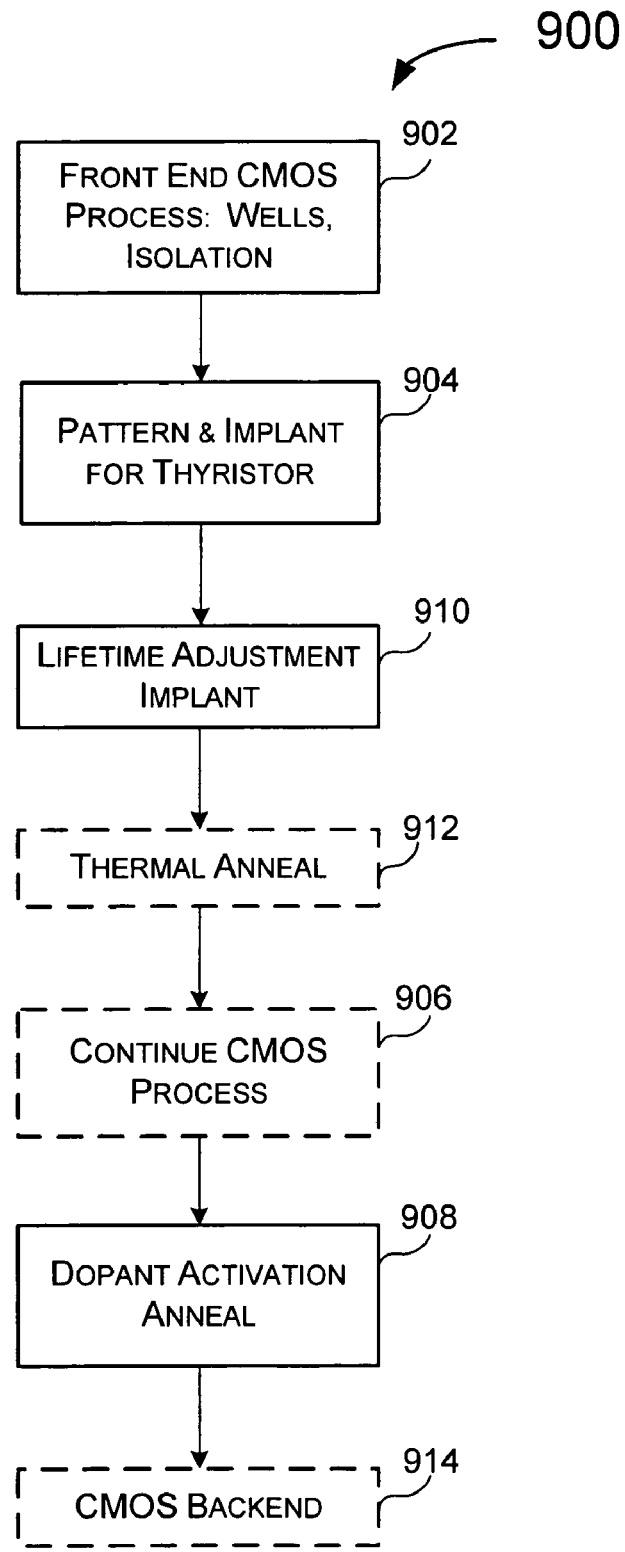
FIG. 9 is a simplified flow chart useful for describing a method of processing a thyristor-based memory device in accordance with another embodiment of the present invention, and showing a lifetime adjustment implant and an anneal in an early stage of the fabrication flow.

Referencing FIGS. 8A and 9, another particular method 900 of forming a thyristor memory may further comprise implanting (block 910 of FIG. 9) of lifetime adjustment species such as carbon into a low-lifetime region 857 after performing preliminary CMOS processes (block 902) and after performing implants (block 904) for thyristor's N-base and anode-emitter regions. In one such embodiment, the lifetime adjustment implant of carbon may be implanted with energy of about 13 keV, 45 degrees tilt and dosage of about $5\times10^{15}$ atoms per $cm^2$. In a particular case, the deep level implants for the MOSFET source and drain regions may have already been performed and fabrication may then continue with temperature anneal(s) (blocks 912, 908) as may be dedicated for the lifetime adjustment species and/or integrated together with the dopant activation anneals. For some alternative embodiments, the deep level implants for source and drain regions 822, 886 may be performed (block 906) after the thyristor implants and before the anneals.

Further referencing FIG. 9, in accordance with a further embodiment, a single anneal may be used to anneal, collectively, the implanted lifetime adjustment species such as carbon and to activate/anneal dopants that have been implanted for the different N-type and P-type regions of the MOSFET and thyristor devices. For example, the anneal may use a temperature of between 600 and 1200 degrees Celsius. In a particular example, the anneal may use a temperature of about 1050 degrees Celsius and an exposure duration of about 10 seconds to both activate dopants and process the lifetime adjustment region.

In further embodiments additional duration or temperature may be used for anneal of certain lifetime adjustment species. Accordingly, annealing may be performed (block 912) before some of the CMOS processes (block 906) and dopant activation (block 908).

Figure 10:
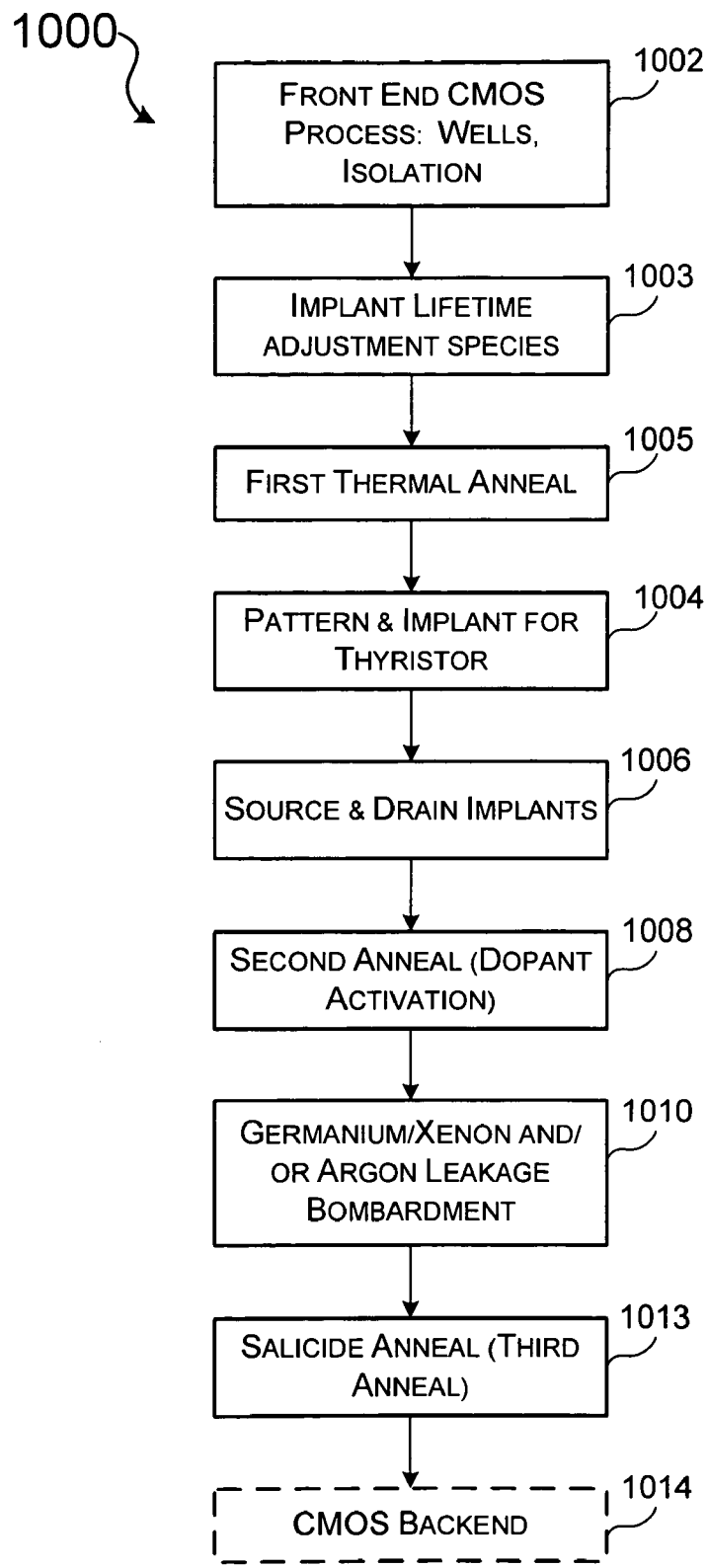
FIG. 10 is a simplified flow chart useful for describing a method of processing a thyristor-based memory device in accordance with an embodiment of the present invention, showing an implant of lifetime adjustment species with an associated anneal in an early stage of fabrication and also a leakage bombardment with an associated lower-temperature anneal in a later stage of the fabrication.

For example, referencing FIG. 10, an implant 1003 of lifetime adjustment species such as carbon may be performed before beginning the patterning and implant for thyristor regions and also before performing the patterning of dopant implants for the access device. An anneal 1005 may then be performed for the implant of the lifetime adjustment species. In a particular example, the carbon may be implanted using energy of about 13 keV and dosage of about $5 \times 10^{15}$ atoms per centimeter squared, and the anneal may use a temperature of between about 800 to 900 degrees Celsius for a duration of about 10 seconds or longer. Thereafter, the dopants may be introduced (blocks 1004, 1006) for the access device and thyristor without concern for the diffusion thereof that might otherwise occur if subject to the anneal as may be associated with incorporation of carbon as the lifetime adjustment species.

Following the first thermal anneal 1005, for this embodiment referenced relative to FIG. 10, regions for the thyristor and MOSFET may be formed (blocks 1004 and 1006 of FIG. 10) similarly as described previously herein. After forming the various regions of the thyristor and MOSFET device with the dopant implants, the dopants may then be activated (block 1008) using a second anneal temperature between about 900 and 1100 degrees Celsius and, more typically, a temperature of 1050 degrees Celsius for a duration of up to 10 seconds.

Following the dopant activations, a portion of a junction region defined between the anode-emitter and N-base of the thyristor may then be bombarded (block 1010) with at least one of germanium, argon and xenon for transitioning at least a portion of the junction region into an amorphous or polysilicon material state. An energy and dosage for the xenon, argon and/or germanium bombardment may be selected sufficient to form micro defects and a high density therefor, e.g., of about $10^{19}$ per cm$^3$ as may be effectively modeled.

In a particular embodiment, returning back to referencing FIG. 6C, resist may be layered and patterned over the substrate for defining a window and exposing the regions of the anode-emitter region. The edge of the photoresist may be aligned with or proximate the edges of the salicide blocking mask dielectric 635. While using photoresist mask 672, in combination with the salicide blocking material as an implant mask, xenon may be directed toward the silicon using an implant angle of about 45 degrees relative to normal, e.g., an angle of incidence between that used during definition of N-base 614 and that used for the implant of anode-emitter region 612.

Figure 11:
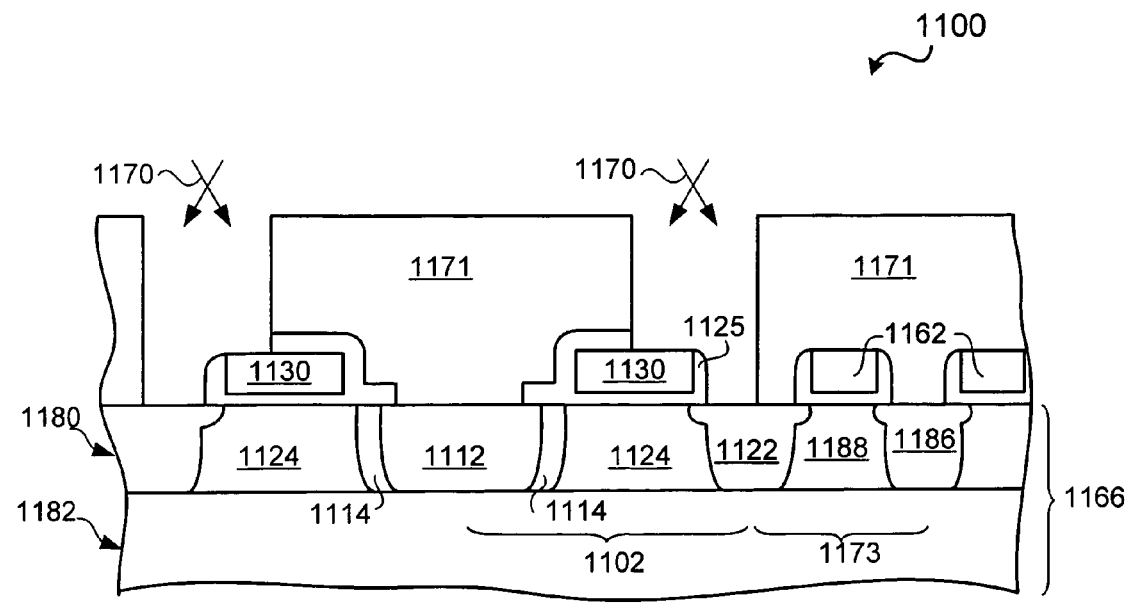
FIG. 11 is a cross sectional view of a portion of a semiconductor substrate useful to further describe a method of fabrication of a thyristor-based semiconductor device for an embodiment of the present invention, showing a damaging implant to at least a portion of the p-n junction region for forming a shunt across the junction region to be operable for low level leakage through a base-emitter junction of a thyristor.
Figure 12:
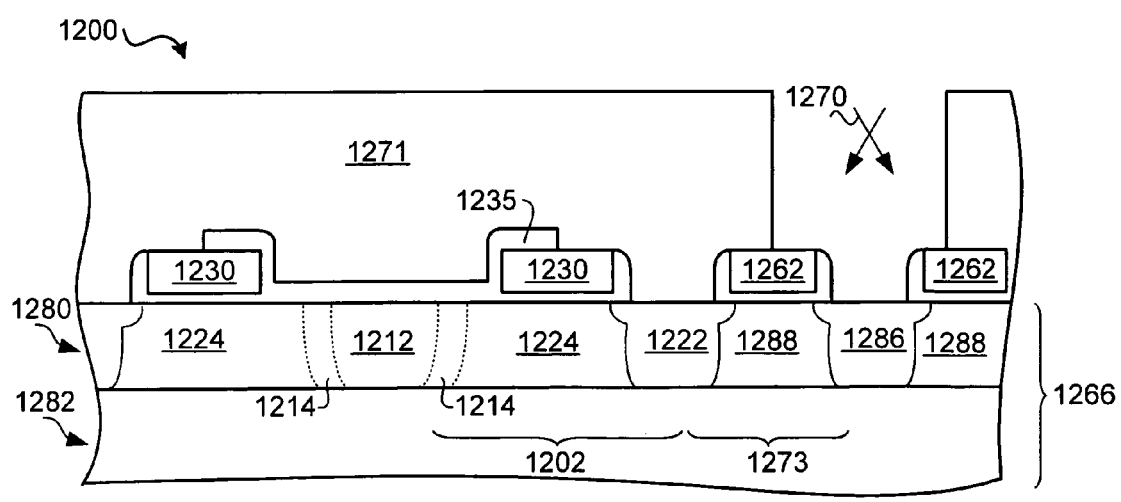
FIG. 12 is a cross sectional view of a portion of a semiconductor device useful to describe a method of fabricating a thyristor-based semiconductor memory for an embodiment of the present invention, showing bombardment of species into at least a portion of the p-n junction region to form a shunt therein to be operable for low level leakage currents across such junction, e.g., between a floating body and source/drain region to a MOSFET device of, e.g., the thyristor-based memory device.

Additionally, referencing FIGS. 11 and 12, the leakage implant or bombardment 1170/1270 of germanium, argon or xenon may also be performed across diode junction regions associated with the P-base 1124 and cathode-emitter 1122 of the thyristor device (FIG. 11); and/or also the diode junction region defined between the body region 1288 and source region 1286 of access MOSFET 1273 (FIG. 12).

Further referencing FIG. 11, ions of xenon, argon and/or germanium may be bombarded 1170 into at least a portion of a p-n junction region associated with the cathode-end portion for the thyristor in substrate 1166. The bombardment with the damaging bombardment element, e.g., may form a low-lifetime region across at least a portion of the p-n junction between P-base 1124 and the cathode-emitter region 1122.

Photoresist mask 1171 may be formed over select regions for access device 1173 and thyristor 1102. The window defined by the photoresist mask 1171 and a portion of electrode 1162 may define alignment of the bombardment element into the select portions of the diode junction region between the P-base and the cathode-emitter region that are to receive the bombardment. Photoresist 1171 taken together with the material for gate electrode 1162 and sidewall spacers 1125, may operate collectively to define the region of semiconductor material that are to receive the ions of, e.g., xenon, argon and/or germanium of the bombardment 1170. In a particular embodiment, xenon may be directed toward the silicon with energy of about 80 keV, an angle of incidence of about 30 degrees, and dosage of about $3 \times 10^{14}$ per cm$^2$.

In some alternative procedures for this implant, a potential aspect ration problem may be overcome and obtain a larger window opening (e.g., middle of WL1 1162 to middle of WL2 1125) formed to assist implanting of the junction regions while still protecting the drain junction of the access FET, two different photo steps and associated implants may be performed. A photo and implant may be performed for one "orientation" of cell—e.g., the cell on the right side of anode 1112 (FIG. 11); and a separate photo and implant may be performed for the other orientation cell (e.g., the cell on the left side of anode 1112). It may be understood that the respective photo-resist masks in combination with their associated single oriented implant may assure distribution of the implant species into the thyristor while protecting the access transistor. In other words, in view of the separate single oriented angle of implant; the height of the resist over first wordline 1162 may be understood to shadow the body-to-drain region of the access transistor 1173 and protect it from the implant species being directed toward the P-base-to-cathode junction region.

In yet a further embodiment of the present invention, referencing FIG. 12, the germanium, argon and/or xenon may also be directed 1270 into another p-n junction associated with a series of at least three contiguous regions of opposite polarity semiconductor material. In this embodiment, the leakage bombardment may be directed to at least a portion of the diode-junction defined between a body region 1288 and a source region 1286 for a MOSFET 1273 device. This impact region may be defined by a window of photoresist mask 1271, taken collectively with gate electrodes 1262 of neighboring mirror image access devices. In this example, the mask defines a portion of the silicon associated with source region 1286 through which to perform the angle leakage bombardment 1270.

Following these leakage bombardments with germanium, argon and/or xenon (block 1010 of FIG. 10), an anneal may then be performed (within block 1013) for repairing some of the damage within the silicon. Again, the xenon, argon and/or germanium ions from the bombardment may have sufficient impact energy to transform regions of the silicon into poly and/or an amorphous material state. In particular procedures, after the bombardment, the anneal may then be performed to restore some of the damaged regions by re-crystallizing some into the lattice structure. The temperature and the duration for the anneal may be selected appropriately so as to repair some, but not all regions. Therefore, residual crystalline defects may remain across at least a portion of the junction regions. These residual crystalline defects, in turn, may affect the lifetime of carriers within the shunt region and/or allow low-level currents to flow across the junction region during operation of the junction regions as may be incorporated within a thyristor-based memory cell.

In certain embodiments of the present invention, silicide may be formed over select regions of the thyristor and access device in order to lower resistance of these regions (block 1013 of FIG. 10). For example, the thyristor memory as may be represented by FIG. 6C, may comprise a portion of anode-emitter region 612 and cathode-emitter region 622 in common with drain/source region that may receive silicide. Also, exposed portions of source/drain region 686, and also exposed portions of electrode 630 over thyristor 602 and gate electrode 662 of MOSFET 673 may also receive silicide.

During the formation of the silicide regions, temperatures may be used of magnitude sufficient to diffuse metal into the silicon. Although the magnitude of the siliciding temperature (e.g., 500 degrees Celsius) may be lower than those for activating dopants (e.g. 1050 degrees Celsius), these silicide anneal temperatures may, for certain embodiments, be effective for at least a portion of the post-leakage-bombardment anneal. Further, the temperature and duration of this "third" anneal may be selected for achieving a thermal budget capable of controlling migration of previous dopant implants.

In a particular embodiment, photoresist mask 872/1171/1271 may be removed for leaving patterned dielectric 1125, 1235 and salicide blocking material (SAB) as a mask, which may comprise nitride of a thickness, e.g., greater than 900 angstroms. It may be noted that dielectric spacers 1125 against the sidewalls of the MOSFET electrode 1262 and SAB 1235 material against and over a shoulder of capacitor electrode 1230 may define the exposed regions of silicon 1280 to receive silicide.

Refractory metal may be deposited, such as tungsten, nickel, cobalt, platinum, or titanium. A heat treatment may then diffuse metal of the deposited metal into select exposed regions and also select exposed regions of the electrodes. The metal diffusion heat treatment may use a temperature sufficient to cause the metal to react with the silicon but low enough that no metal/dielectric (SAB) reaction occurs. In a particular embodiment, the heat treatment for the metal diffusion may use a temperature of around ~500 degrees Celsius. Metal may diffuse into the surface of the exposed portions of silicon 1180 and polysilicon of electrodes 1130,1162. After reacting the metal (siliciding) with the select regions of semiconductor material as defined by the dielectric mask, unreacted portions of the metal may then be stripped. In a particular example, the residual metal may be stripped by briefly dipping the device in an acid bath for removing the residual metal and leaving silicide on at least portions of the drain and source regions of MOSFET device, anode-emitter regions of the thyristor and on at least portions of the electrodes. A silicide anneal may then be performed using a temperature, e.g., of about 700 degrees Celsius. Both the heat treatment for the metal diffusion and the subsequent silicide anneal may be understood to serve in part as a portion of the recrystallization anneal for regions of the silicon layer previously bombarded with the germanium, argon and/or xenon.

After siliciding the exposed regions, additional backend processing (blocks 1014 of FIG. 10) of the semiconductor device may continue for interconnecting the different devices and transistors with other elements (not shown) of the semiconductor device. Through such additional backend processing, e.g., insulating materials may be formed over the structures and appropriate conductive interconnects patterned to respective contacts of the gates, electrodes, source/drain regions and/or emitter regions for forming the overall integrated circuit, such as a memory integrated circuit.

Figure 13A:
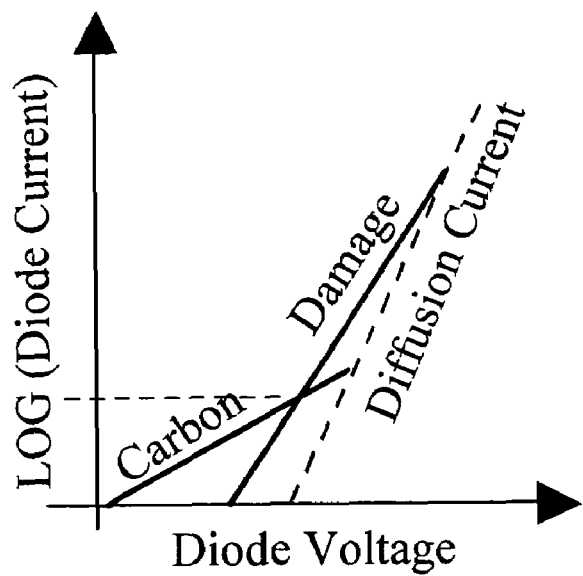
FIGS. 13A and 13B show current-voltage and gain-current curves useful for developing an understanding of characteristics for certain embodiments of the present invention.
Figure 13B:
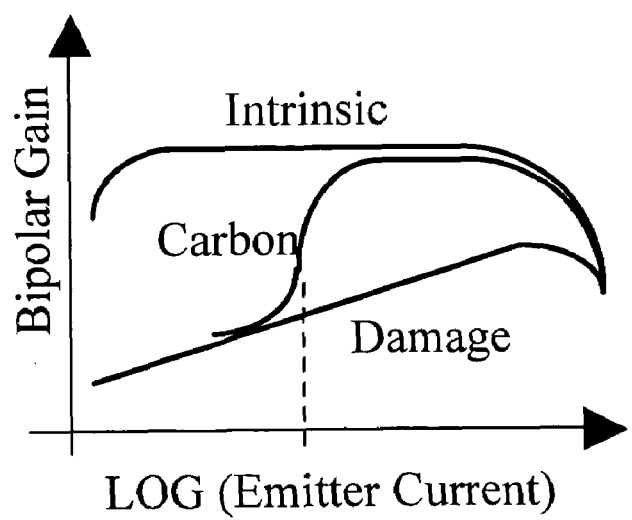
Figure 14A:
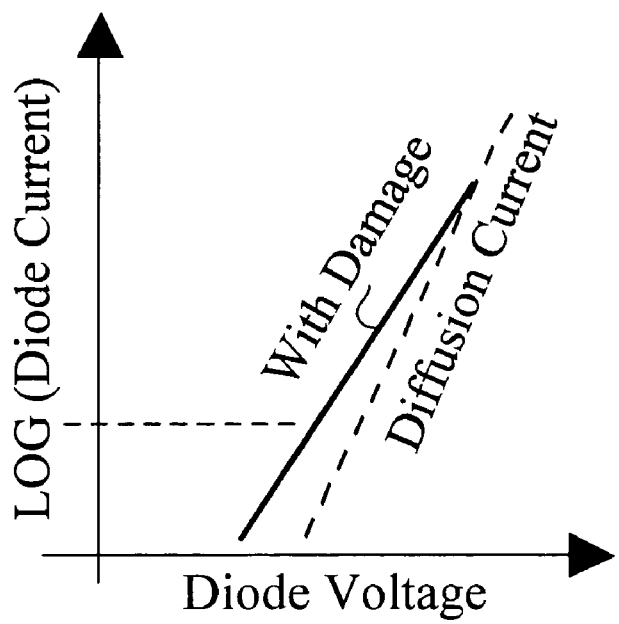
FIGS. 14A and 14B show simplified current-versus-voltage curves for a diode junction and gain-versus-current curves for a bipolar device useful for developing an understanding of characteristics for certain embodiments of the present invention as may be attributed to damage bombardment or implants.
Figure 14B:
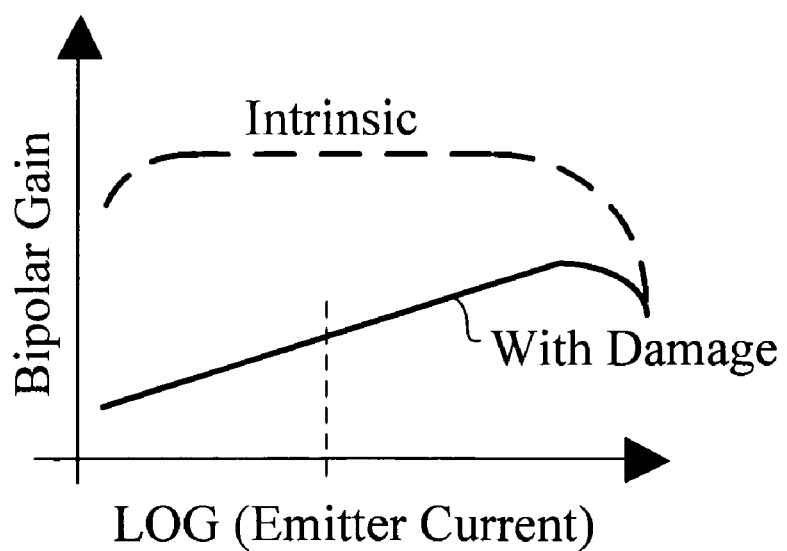

Referencing FIGS. 13A and 13B, an understanding of thyristor-based memory cells in accordance with various embodiments of the present invention may be assisted by examining different current-voltage curves for a diode junction region as presented in FIG. 13A and/or the different gain-versus-current curves for a bipolar device as presented in FIG. 13B. An ideal diode junction region of, e.g., a thyristor device, absent a shunt with lifetime adjustment species and/or damage implants, might show a current diffusion characteristic across its base-emitter junction region as represented by the curve labeled "Diffusion Current". Likewise, the associated gain lent to a bipolar device over a range of current levels may be represented by an intrinsic gain characteristic as represented by the curve labeled "Intrinsic" in FIG. 13B.

For some embodiments of the present invention, e.g., per methods of fabrication described previously herein relative to FIG. 10 and/or for those incorporating leakage bombardment species of germanium, argon and/or xenon in combination with associated late introduction within the process flow and the given temperature of the recrystallization anneal; the base-emitter junction region may generally be characterized by a leakage component across a low bias range—e.g., as represented by the curve labeled "damage" in FIG. 13A. The leakage properties, in turn, may be theorized or modeled to impact and dominate the effects for the gain of a bipolar device within the thyristor, wherein the bipolar device may show a gain-versus-current property as represented simplistically by the curve labeled "damage" in FIG. 13B. Essentially, it may be observed or speculated by modeling that in the low bias region, where the leakage current component dominates, that the gain for the bipolar transistor may be degraded.

For some other embodiments of the present invention, e.g., per methods of fabrication described previously herein relative to FIG. 10 and/or those that may use carbon for the lifetime adjustment species, the base-emitter junction region may be characterized over a first current range with a low-level leakage that may be dominated by the carbon implant component, as represented by the curve labeled "Carbon" in FIG. 13A. At some point, or some bias level, the magnitude from the carbon leakage component may correspond to that of the ideal diode (Diffusion Current). Related to this relative level of bias, the bipolar device may be characterized with a transition in its gain, (see the curve labeled "Carbon" in FIG. 13B). The gain may thus transition from a low or degraded level to a higher-level gain dependent on the bias region where the magnitude of the carbon-effected leakage is comparable to that of the ideal diode. In other words, the slope of the log (current) vs. voltage curve for the junction with the carbon-type implant may be relatively "flat" through a low bias region. But, the slope therefor may approach that of an ideal (diffusion) current over the higher bias levels. Likewise, the bipolar transistor of the thyristor that may incorporate the carbon implanted base-emitter junction may show a suppressed gain over the low current levels and a nearly ideal or intrinsic gain characteristic over the higher current levels. This transition in gain may be viewed, therefor, to further assist stability of the thyristor; even beyond the stability level that may already be offered by the damage bombardment leakage effects. It may be noted that this type of gain-leakage characteristic may assist with immunity to noise for the thyristor when holding a zero state via the low-level leakage at the lower bias region. At the same time, it may not degrade retention of data for the device when retaining a one state via the near-intrinsic gain beyond the transition region, while permitting a lower-holding current during retention of the one-state.

Returning to particular embodiments of the present invention incorporating damage implant or damage bombardment procedures, referencing FIGS. 14A-14B and 15A-15B, the selection of bombardment species in combination with the point at which they may be introduced into the fabrication flow may be found to impact an ability to target a given gain for the thyristor device design and may similarly be found to impact product yields therefor. Again, as shown by the damage and diffusion current curves of FIG. 14A, the damaging implants may enhance the current that may flow through the diode junction over low-voltage bias regions. In turn, the shape of bipolar gain or bipolar device within the thyristor may, therefore, show a bipolar gain that is suppressed in the low current bias range, while increasing across the higher current bias regions. This change in gain with respect to current level may be understood to assist stability of thyristor operation as described previously with reference to FIG. 13B.

Figure 15A:
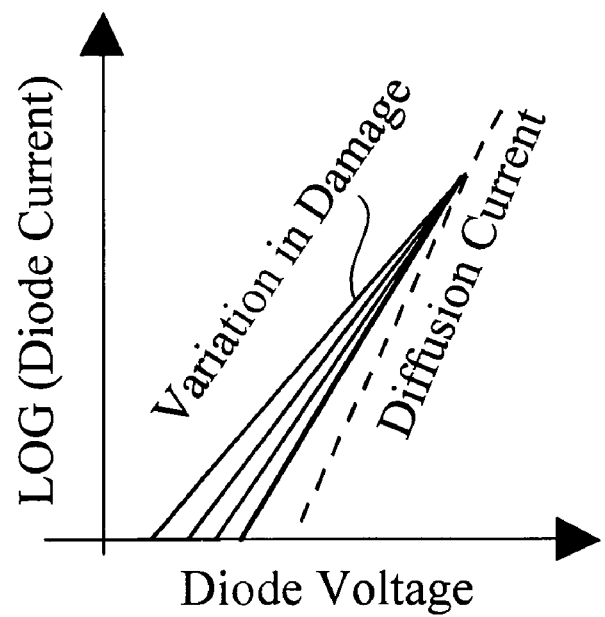
FIGS. 15A and 15B show current-versus-voltage curves for a diode junction region useful for developing an understanding of characteristics for certain embodiments of the present invention as may be related to particular species for damage bombardments and a respective point of insertion to a given fabrication flow.
Figure 15B:
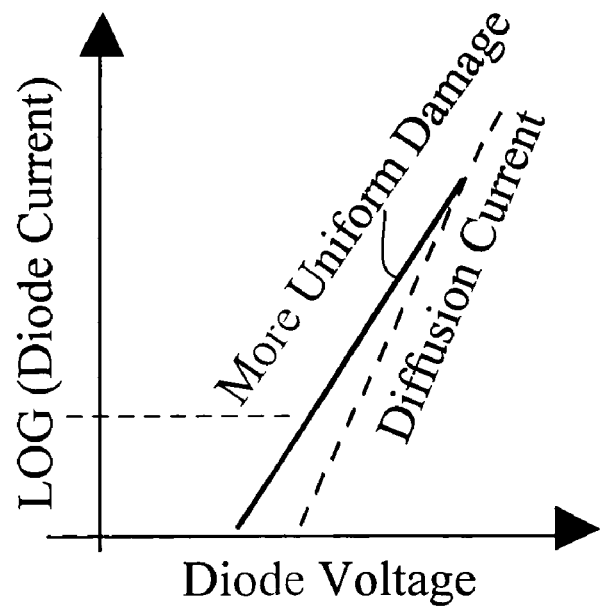

Importantly, for particular embodiments, moving forward with reference to FIG. 15B and FIG. 7, the damage implants may be performed using an element comprising at least one of germanium, argon and xenon. Further, the damaging bombardment or implant may be performed after dopant activations and/or before salicide processes. It has been found that, by such process of fabrication as described previously herein relative to FIG. 7, with use of germanium, argon and/or xenon for the leakage bombardment/implants taken together with associated anneals of temperature less than the activation anneals and associated placements thereof in the fabrication flow following the activation anneals, the process may effect more consistent leakage characteristics to a diode junction. As represented in FIG. 15B by the curve labeled "more uniform damage" and depicted in relative relationship with respect to the typical diffusion current curve of known embodiments employing alternative procedures with the damage implants, such embodiments of the present invention may be seen to offer reduced variation in resulting leakage current characteristics.

It may be understood that variation in leakage current characteristics as represented by various curves labeled "variation in damage" as illustrated in FIG. 15A; such variation may be deemed, as recognized herein, to vary associated gain-versus-current characteristics to bipolar devices of a thyristor. Accordingly, the ability to achieve a targeted design goal for the thyristor may be compromised as well as the associated production yields.

By embodiments of the present invention as disclosed herein, e.g., incorporating xenon, argon or germanium damaging bombardments together with late introduction within the process flow and temperature of recrystallization anneal less than that of the activation anneal; diode leakage characteristics may be produced with greater consistency along with associated gain-versus-current characteristics lent to bipolar transistors of the thyristor. As described previously herein relative to FIG. 7, the leakage and/or damaging bombardments may be performed after the high temperature source/drain dopant activation anneals of temperatures, e.g., greater than 900 degrees Celsius. The post-leakage-bombardment anneals may, thus, use anneal temperatures less than 900 degrees Celsius and duration as long as that associated with, e.g., silicide processes.

Theoretically, it may be proposed that the heavier of the elements of, argon, germanium and xenon for damaging bombardments may lend a mass sufficiently great to perhaps assist with greater resolution in defining impact zones as may be aligned by the patterning of masks over the substrate. In other words, the zone of impact that may be aligned and defined more precisely with less concerns of variation and/or lateral straggle as may be associated with the penetrating ions.

Furthermore, it may be theorized that these heavier elements might have a greater capacity to dislodge atoms of a given lattice structure as opposed to being deflected. The heavier of the bombardment ions may be described as offering a greater propensity for producing crystalline defects.

Furthermore, with recrystallization anneal temperatures less than those that may be associated with dopant activations, and in combination with given durations for the post-damage repair anneal for assisting placement of lattice realignment within the silicon structure, defects of finer granularity may be achieved. Further, the temperature of the recrystallization anneal may be sufficiently low to avoid excessive diffusion of, e.g., base or emitter region dopants. Although an average size for such proposed defects may not be discernable; an understanding and modeling of the devices in such manner may assist product design and fabrication processes.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such modifications and changes do not depart from the true spirit and scope of the present invention that may be set forth in the following claims.

What is claimed is:

1. A method of forming a thyristor-based semiconductor memory device, comprising:

implanting dopant for defining a thyristor and an access device for a memory cell in semiconductor material;

annealing the semiconductor material and activating the dopant implanted;

after the annealing and the activating, bombarding with given species a select region of the semiconductor material including at least one junction region for the memory cell and dislocating at least a portion of the atoms in the select region; and re-annealing the semiconductor material and re-crystallizing part of the bombarded region, the re-anneal for the partial re-crystallization using a temperature less than that of the anneal for the activation and leaving a further portion of the bombarded region with at least partial dislocations.

2. The method of claim 1, in which the implanting of the dopants comprises forming a drain region and a source region with a body region defined therebetween for the access device; and said method further comprises forming a mask with a window, the window in combination with an angle of incidence for the bombardment with given species to define the select region to include at least a portion of the junction between the source and body regions.

3. The method of claim 2, in which the semiconductor material comprises silicon, and the bombarding uses at least one of germanium, xenon, and argon as the given species.

4. The method of claim 3, in which the window formed by the mask in combination with the angle of incidence for the bombardment further define the select region to encompass at least a portion of a base-emitter junction region for the thyristor.

5. The method of claim 1, further comprising:
forming a first gate electrode capacitively coupled to the body region for the access device;
forming spacers against sidewalls of the first gate electrode; and
patterning photoresist over the semiconductor material and forming a mask window, and using the first gate electrode and the spacers to define at least part of the sidewalls of the mask for defining the window;
the bombarding to penetrate the select regions as defined by the window.

6. The method of claim 1, in which the bombarding uses at least one of germanium and xenon and argon as the given species; and
the re-anneal for the partial re-crystallization uses a temperature less than 900 degrees Celsius.

7. The method of claim 1, in which the activation anneal uses a temperature of at least 900 degrees Celsius for a first duration; and
the re-anneal for partial re-crystallization uses a temperature less than 900 degrees Celsius of duration substantially greater than the first duration.

8. The method of claim 1, further comprising:
performing said method to form a plurality of the thyristor-based semiconductor memory device;
defining a given level of uniformity desired for the plurality of the thyristor-based memory devices; and
determining at least one of (i) a mass for an element of the given species, and (ii) a level for the temperature of the re-annealing, sufficient for meeting the uniformity defined;
wherein the bombarding and the dislocating uses an element of at least the mass determined as the given species; and
the re-annealing for the partial re-crystallizing use a temperature of the level determined.

9. The method of claim 8, in which the defining the uniformity is based upon a predetermined leakage current characteristic desired for each of the plurality of thyristor-based memory.

10. A method of fabricating a thyristor-based memory, comprising:
forming in semiconductor material different opposite conductivity-type regions for defining a thyristor and an access device in series relationship to the thyristor;
performing an activation anneal to activate dopant in the different regions of the semiconductor material defining the thyristor and the access device;
forming a mask with a window to define select regions of the semiconductor material, the select regions to include at least one p-n junction region for the access device and the thyristor; and
after the activation anneal and the forming the mask, implanting at least one of germanium and xenon and argon into the select regions of the semiconductor material to damage at least a portion of the lattice structure of the semiconductor material for the at least one p-n junction region; and
re-annealing the semiconductor material to partially re-crystallize the damaged portion, the re-anneal for the partial re-crystallization using a temperature less than that for the activation anneal.

11. The method of claim 10 further comprising:
siliciding exposed surface regions of silicon of the thyristors and the access devices, the siliciding comprising:
depositing metal onto the exposed surface regions,
heating the metal and the silicon and diffusing a portion of the metal into the silicon to form a silicide therewith,
removing residual portions of the metal following the heating and diffusing, and
annealing the silicide;
the re-anneal for the re-crystallization performed at least in part by the heating the metal for the diffusing and the annealing the silicide.

12. The method of claim 11, further comprising implanting lifetime adjustment species into a portion of the semiconductor material for the thyristor and affecting carrier lifetime therein.

13. The method of claim 12, in which the implanting lifetime adjustment species uses at least one species of the group consisting of a metal and an element from group IVA of the periodic table.

14. A method of fabricating a thyristor-based memory, comprising:
forming in semiconductor material different opposite conductivity-type regions for defining a thyristor and an access device in series relationship to the thyristor;
performing an activation anneal to activate dopant in the different regions of the semiconductor material defining the thyristor and the access device;
forming a mask with a window to define select regions of the semiconductor material, the select regions to include at least one p-n junction region for the access device and the thyristor; and
after the performing the activation anneal and the forming the mask, implanting at least one of germanium and xenon and argon into the select regions of the semiconductor material to damage at least a portion of the lattice structure of the semiconductor material for the at least one p-n junction region;
re-annealing the semiconductor material to at least partially re-crystallize some of the damaged portion, the re-annealing using a temperature less than that for the activation anneal; and
siliciding exposed surface regions of silicon of the thyristors and the access devices, the siliciding comprising:
depositing metal onto the exposed surface regions,
heating the metal and the silicon and diffusing a portion of the metal into the silicon to form a silicide therewith,
removing residual portions of the metal following the heating and diffusing, and
annealing the silicide;
wherein the re-annealing is performed at least in part by the heating of the metal for the diffusing and the annealing the silicide;
said method further comprising implanting into a portion of the semiconductor material for the thyristor, lifetime adjustment species of the group consisting of a metal and an element from group IVA of the periodic tablet; and
the lifetime adjustment species comprises carbon and is implanted before the forming the different opposite conductivity-type regions for the thyristor.

15. The method of claim 14, further comprising:
treating the semiconductor material with a first anneal after the implanting with the lifetime adjustment species and before implanting dopants for the opposite conductivity-type regions for the thyristor; and
using a temperature for the first anneal of magnitude greater than that for the activation anneal.

16. The method of claim 15, in which the implanting of carbon distributes the carbon implants across a base-to-emitter junction region for the thyristor.

17. The method of claim 16, in which the damaging implant impacts the junction region for between the anode-emitter and the n-base regions for the thyristor and the carbon implants impact the junction region for between the cathode-emitter and the p-base regions for the thyristor.

18. The method of claim 10, in which the activation anneal uses a temperature of at least 900 degrees Celsius; and
the re-annealing uses a temperature less than 900 degrees Celsius.

19. The method of claim 10, in which the damaging implant comprises directing ions of at least one of xenon and argon toward the select regions of the semiconductor material with an energy sufficient to dislocate at least a portion of the semiconductor material from its lattice structure.

20. The method of claim 10, in which each access device is formed as a MOSFET; and the damaging implant includes impacting the source-body junction region for the MOSFET as a part of the select region.

21. The method of claim 20, further comprising protecting the drain-body junction region for the MOSFET during the damaging implant of the source-body junction region and forming the MOSFET asymmetrically for a diode leakage current characteristic at the source-body junction region to be greater than that for the drain-body junction region.

22. A method of forming a thyristor-based semiconductor memory device, comprising:
forming first, second, third and fourth regions of opposite sequential conductivity-type in contiguous relationship for a thyristor in semiconductor material over an insulator;
activating dopants of the first, second, third and fourth regions using an activation anneal of temperature of at least 900 degrees Celsius;
bombarding at least a portion of a junction region defined between the first and the second regions with at least one of germanium and xenon and argon using an energy sufficient to damage a crystalline structure of the semiconductor material and to form defects in the semiconductor material across the junction region; and
performing the bombarding after the activation anneal.

23. The method of claim 22, further comprising:
forming an electrode capacitively coupled to one of the second and third regions of the thyristor; and
the bombarding forms a shunt across at least one of the base-emitter junction regions of the thyristor.

24. The method of claim 23, further comprising:
performing a recrystallization anneal after the bombarding; and
using a temperature for the recrystallization anneal of magnitude less than 900 degrees Celsius.

25. The method of claim 24, further comprising performing the recrystallization anneal for a duration greater than that for the activation anneal.

26. The method of claim 24, in which the forming the first, the second, the third and the fourth regions of opposite sequential conductivity-type is performed for each thyristor of a plurality of said thyristors; said method further comprising:
determining and using at least one of (i) a dosage of the at least one of the germanium and xenon and argon, and (ii) an energy therefore for the implanting in combination with (iii) a temperature of the recrystallization anneal sufficient to form the thyristors of said plurality with a predetermined level of uniformity.

27. The method of claim 26, the determining of said at least one of the dosage, the energy and the temperature based upon a predetermined level of uniformity desired for leakage current characteristics to the thyristors to be formed for said plurality.

* * * * *